United States Patent [19]

Mano et al.

[11] Patent Number: 4,771,404
[45] Date of Patent: Sep. 13, 1988

[54] MEMORY DEVICE EMPLOYING MULTILEVEL STORAGE CIRCUITS

[75] Inventors: Tsuneo Mano, Isehara; Junzo Yamada, Ebina; Nobutaro Shibata, Zama, all of Japan

[73] Assignee: Nippon Telegraph and Telephone Corporation, Tokyo, Japan

[21] Appl. No.: 770,087

[22] Filed: Aug. 28, 1985

[30] Foreign Application Priority Data

Sep. 5, 1984 [JP] Japan .................. 59-185744
Nov. 13, 1984 [JP] Japan .................. 59-238809
Jan. 30, 1985 [JP] Japan .................. 60-16331

[51] Int. Cl.⁴ .................. G11C 7/00; G11C 8/00; G06F 15/00
[52] U.S. Cl. .................. 365/189; 365/220; 365/230; 365/238; 364/200
[58] Field of Search .................. 365/189, 182, 149, 230, 365/184, 220, 221, 238; 364/200, 900

[56] References Cited

U.S. PATENT DOCUMENTS

| 4,134,150 | 1/1979 | Shiga | 365/154 |
| 4,493,059 | 1/1985 | Isogai | 365/154 |
| 4,661,929 | 4/1987 | Aoki et al. | 365/230 |

*Primary Examiner*—Terrell W. Fears
*Assistant Examiner*—Melissa J. Koval
*Attorney, Agent, or Firm*—Staas & Halsey

[57] ABSTRACT

A memory device which employs multilevel memory cells has a basic arrangement in which a write device writes multilevel information corresponding to binary data of plural bits in the memory cells and a readout device outputs binary data of plural bits representing the multilevel information read out of the memory cells. The memory device includes a multilevel detector for detecting the information of the memory cells at one time and reference level generator for generating reference levels therefor, thereby permitting the reduction of the bit area of each memory cell and increased speed during the operation of the memory device.

13 Claims, 15 Drawing Sheets

| $S_1$ | $S_2$ | $F_1$ $F_1'$ | $F_2$ $F_2'$ | $F_3$ $F_3'$ | $F_4$ $F_4'$ | VOLTAGE | $P_1$ | $P_1'$ | $P_2$ | $P_2'$ | $P_3$ | $P_3'$ |
|---|---|---|---|---|---|---|---|---|---|---|---|---|
| 0 | 0 | 1 | 0 | 0 | 0 | $V_1$ | 0 | 1 | 0 | 1 | 0 | 1 |
| 0 | 1 | 0 | 1 | 0 | 0 | $V_2$ | 1 | 0 | 0 | 1 | 0 | 1 |
| 1 | 0 | 0 | 0 | 1 | 0 | $V_3$ | 1 | 0 | 1 | 0 | 0 | 1 |
| 1 | 1 | 0 | 0 | 0 | 1 | $V_4$ | 1 | 0 | 1 | 0 | 1 | 0 |

P(2) BIT BINARY DATA

DIGITAL SIGNAL CORRESPONDING TO THE q(4) LEVEL INFORMATION q-LEVEL INFORMATION

SENSE CIRCUIT OUTPUT SIGNAL

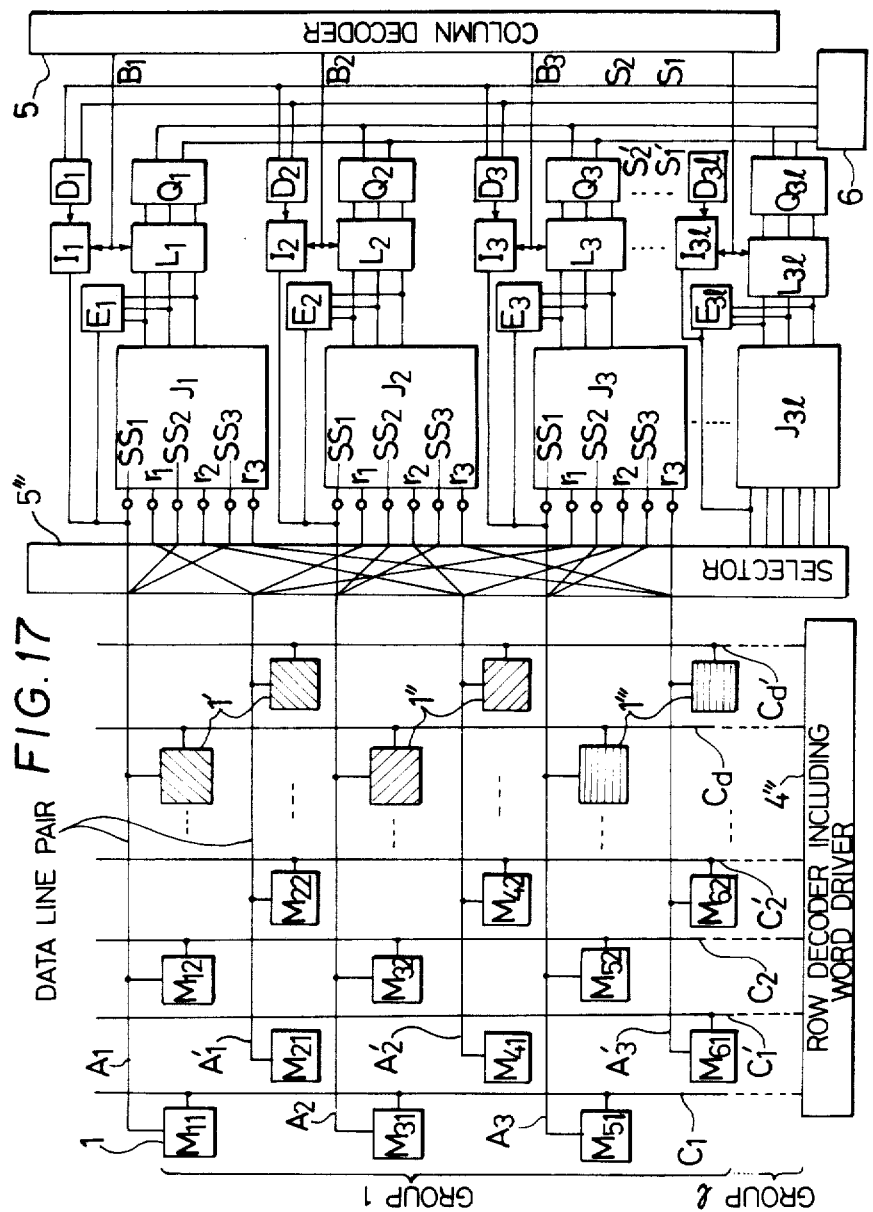

MEMORY DEVICE EMPLOYING MULTILEVEL STORAGE CIRCUITS

BACKGROUND OF THE INVENTION

1. Field of the Invention

The present invention relates to a memory device which employs multilevel memory circuits (multilevel memory cells), and more particularly to a high-speed, multilevel DRAM (Dynamic Random Access Memory) structure which permits increased speed during memory operation and reduction of the bit area (an area necessary for storing one bit).

2. Description of the Related Art

Heretofore there have been proposed a variety of memory devices of the type that have m.n (where $m \leq 1$ and $n \leq 1$ m,n: integer) memory cells $M_{11}$ to $M_{1n}$, $M_{21}$ to $M_{2n}$ ... and $M_{m1}$ to $M_{mn}$, m bit lines (data lines) $A_1$ to $A_m$, m column select lines $B_1$ to $B_m$ and n word lines $C_1$ to $C_m$ and in which, in the state of one of the memory cells $M_{1j}$ to $M_{mj}$ (where j=1 to n) is selected by a word select signal from the word line $C_j$, information is provided on the bit line $A_i$ using a column select signal from the column select line $B_i$ for storage in the memory cell $M_{ij}$ and the information is read out of the data line $A_i$ using a column select signal from the column select line $B_i$.

In general, however, conventional memory devices are arranged so that binary information of one bit, which assumes a "1" or "0" in the binary representation, is stored in or read out of the memory cell $M_{ij}$.

Because of this, the overall storage capacity of the memory device is limited specifically to $m \times n$ bits which is equal to the number of memory cells $M_{1l}$ to $M_{1n}$, $M_{21}$ to $M_{2n}$, ... and $M_{ml}$ to $M_{mn}$. Accordingly, an increase in the overall storage capacity of the memory device will call for an increase in the number, $m \times n$, of the memory cells, resulting in the memory device as a whole becoming bulky as.

SUMMARY OF THE INVENTION

It is an object of the present invention to provide a novel memory device which has memory cells capable of storing ternary or more information.

Another object of the present invention is to provide a memory device which permits reduction in the bit area.

Another object of the present invention is to provide a memory device which is provided with information readout comparator which can detect, at high speed and at one time, information in memory cells capable of storing ternary or more information.

Yet another object of the present invention is to provide a memory device which has incorporated therein a reference level generator for creating a reference signal for use in detecting, at one time, information in memory cells capable of storing ternary or more information and which is almost free from malfunction.

To attain the above objectives, the memory device of the present invention has an arrangement which is provided with memory cells $M_{11}$ to $M_{1n}$, $M_{21}$ to $M_{2n}$, ... and $M_{ml}$ to $M_{mn}$, m bit lines $A_1$ to $A_m$, m column select lines $B_1$ to $B_m$ and n word lines $C_1$ to $C_n$ and in which, in the state of one of the memory cells $M_{ij}$ to $M_{mj}$ (where j=1 to n) being selected by a word select signal from the word line $C_j$, information is provided on the bit line $A_i$ (Where i=1 to m) using a column select signal from the column select line $B_i$ for storage in the memory cell $M_{ij}$ and the information is read out of the bit line $A_i$ using a column select signal from the column select line $B_i$, as is the case with the conventional memory devices.

However, the memory device of the present invention further includes information write means and information readout means. In the state in which the information write means is selected by a column select signal from the column select line $B_i$, q-level information (Where $q \leq 3$) corresponding to a plurality of binary data is provided on the bit line $A_i$. In the state in which the memory cell $M_{ij}$ is selected by a word select signal from the word line $C_j$, the q-level information on the bit line $A_i$ is stored and the q-level information is provided on the bit line $A_i$. Further, in the state in which the information readout means is selected by a column select signal from the column select line $B_i$, binary data of plural bits corresponding to the q-level information on the bit line $A_i$ is output from the memory cell $M_{ij}$.

With the memory device of such a basic arrangement according to the present invention, the q-level information is stored in and read out of the memory cell $M_{ij}$.

Since the memory device of the present invention is arranged so that the q-level information is stored in and read out of the memory cell $M_{ij}$, as described above, its overall storage capacity can be increased greatly even though the number, $m \times n$, of its memory cells $M_{11}$ to $M_{1n}$, $M_{21}$ to $M_{2n}$, ... and $M_{ml}$ to $M_{mn}$ is the same as that in the prior art.

Accordingly, the present invention has the advantage that the storage capacity of the memory device can be increased to larger than those of the conventional memory devices without making the device bulky.

Incidentally, it is an important factor, in increasing the storage capacity of the memory device, not to reduce the memory operating speed.

In accordance with an aspect of the present invention, to meet the above requirement, multilevel (q-level) information stored in the multilevel memory cell $M_{ij}$ is detected at one time by a plurality of comparators included in a multilevel detector $J_i$. The multilevel detector $J_i$ is provided with $(q-1)$ comparators $R_1$ to $R_{q-1}$ in parallel, each of which has one signal input terminal and one reference input terminal. The $(q-1)$ comparators $R_1$ to $R_{q-1}$ have their signal input terminals connected together to the bit line $A_i$ to which the selected memory cell $M_{ij}$ is connected, and are supplied at their reference input terminals with $(q-1)$ different reference levels.

In accordance with another aspect of the present invention, the memory device has a sense circuit which is suitable for use as the multilevel detector for detecting a multilevel input signal at a high speed and at one time using a plurality of reference signals so as to sense the multilevel information at a high speed. The sense circuit according to the present invention has an arrangement in which an input node for receiving the input signal and an output node for delivering a sensed signal are separated from each other, and takes in a small bit line signal without clock control to detect it at a high speed.

The sense circuit, which is suitable for use in the memory device of the present invention has an arrangement in which a first capacitance is connected between a first node connecting the drain (or source) of a first MOS transistor and the gate of a second MOS transistor of the same conductivity type as the first transistor and the ground, the source (or drain) of a third MOS transistor different in conductivity type from the first MOS transistor is connected to the drain (or source) of the latter. A second capacitance is connected between a second node connecting the gate of the first MOS transistor and the drain (or source) of the second MOS transistor and the ground and the source (or drain) of a fourth MOS transistor different in conductivity type from the second MOS transistor is connected to the drain (or source) of the latter. During operation, the first and second capacitances are charged or discharged to make the first and second nodes of equipotential, after which two input signals, the potential difference between which is to be detected, are applied to the gates of the third and fourth MOS transistors to reflect the detected potential difference in the potential difference between the first and second nodes. Then the first and second capacitances are discharged or charged via the first and second MOS transistors, thereby obtaining across the first and second nodes a sensed output signal in which the potential difference is enlarged or increased.

According to such a sense circuit, after the first and second nodes are made equipotential by charging or discharging the first and second capacitances, two input signals, the potential difference of which is to be detected, are applied to the gates of the third and fourth MOS transistors, by which the potential difference between the first and second nodes reflects the sensed potential difference. Then, by charging or discharging the first and second capacitances via the first and second MOS transistors, a sensed output signal having an enlarged potential difference is provided between the first and second nodes.

Since the sense circuit is of the type in which the input and output are separated from each other, the input signal is not affected by the output, and input nodes of a plurality of such sense circuits can be connected, allowing a high-speed operation because no clock is needed for clocking in the input signal. Therefore, the sense circuit is of great utility when employed in the multilevel detector which has multilevel memory cells. In accordance with yet another aspect of the present invention, the memory device of the present invention has a signal detection system of good noise balance for sensing multilevel information.

With the signal detection system employed in the memory device of the present invention, a plurality of reference levels necessary for the multilevel detector to sense the multilevel (q-level) information of the multilevel information memory cell are efficiently created using dummy cells on the data line. The signal detection system is provided with a row decoder for selecting only memory cells arranged along a specified word line, a selector for selecting a specified data line, at least (q−1) comparators each of which has one signal input terminal and one reference input terminal and which are connected to the selected specified data line and at least (q−1) kinds of dummy cells for generating reference levels on the data lines respectively connected to the reference input terminals of the comparators. During operation, the specified data line, to which are connected memory cells selected under control of the selector, is connected to the signal input terminal of the corresponding comparator and the data line, to which the dummy cell is connected is connected, to the reference input terminal of the comparator circuit.

According to such a signal detection system, since (q−1) reference levels necessary for sensing q-level information are produced by dummy cells with an arrangement as mentioned above, a plurality of reference levels for the readout operation can correctly be set without being affected by an imbalance in the data lines and noise. Furthermore the signal detection system can be formed very compact since it is necessary only to connect each of the different dummy cells to one of the data lines of each group.

Other objects, features and advantages of the present invention will become more fully apparent from the following detailed description taken in conjunction with the accompanying drawings.

BRIEF DESCRIPTION OF THE DRAWINGS

FIG. 17 is a connection diagram illustrating the entire system of the memory device employing quaternary memory cells.

DESCRIPTION OF THE PREFERRED EMBODIMENTS

Figure 1:
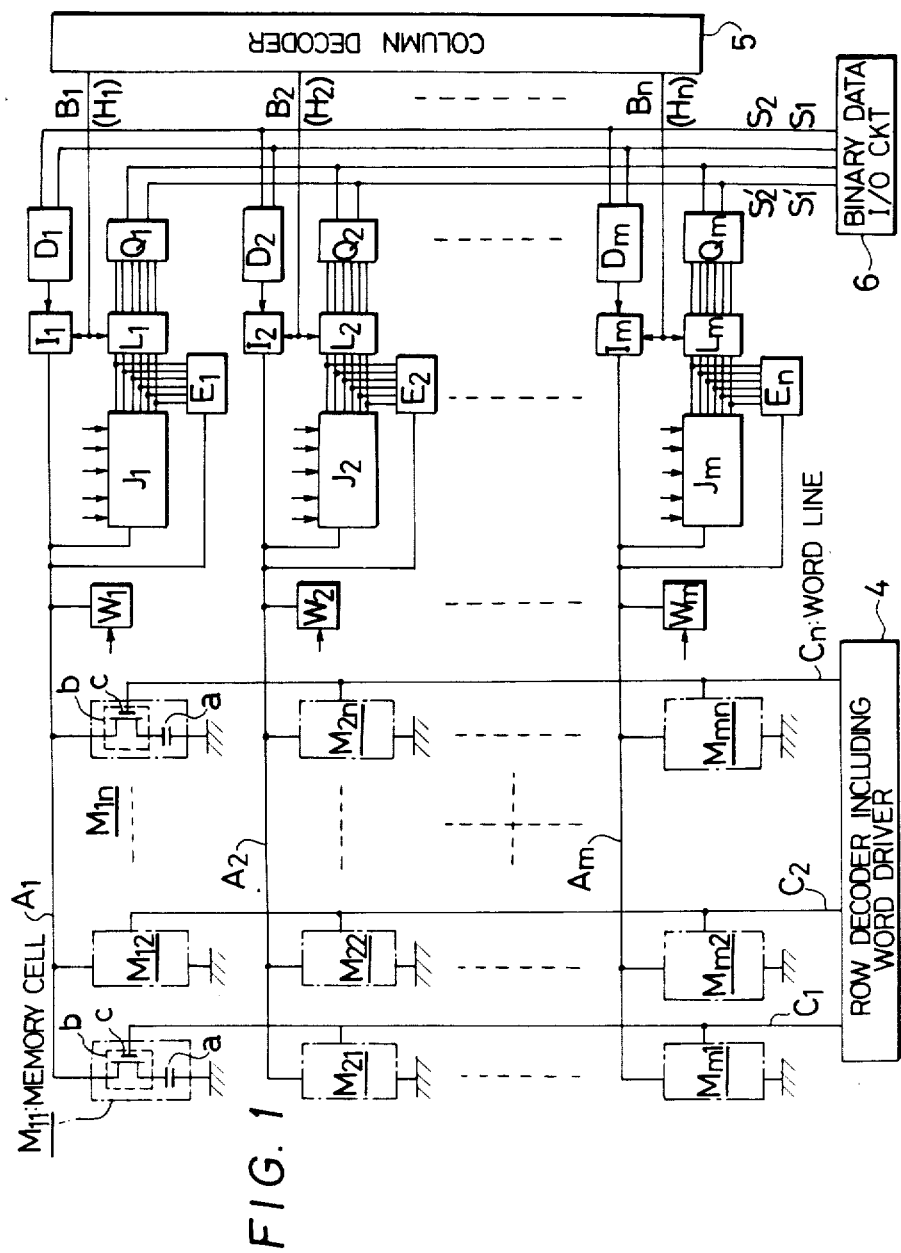
FIG. 1 is a connection diagram illustrating a first embodiment of the memory device of the present invention.

With reference to FIG. 1, an embodiment of the memory device of the present invention will be described, which has m.n (Where $m \geqq 1$ and $n \geqq 1$) memory cells $M_{11}$ to $M_{1n}$, $M_{21}$ to $M_{2n}$, ... and $M_{m1}$ to $M_{mn}$. The memory cell $M_{ij}$ (Where i=1, 2, ... m and j=1, 2, ... n) comprises a gate circuit b formed by a FET c, which is turned ON when a word select signal from a word line $C_j$ described later is a "1" in terms of the binary representation, and a storage capacitor a. The memory device has m data lines $A_1$ to $A_m$. The data line $A_i$ (where i=1, 2, . . . m) is connected via the FET c of the gate circuit b of each of the memory cells $M_{i1}$ to $M_{in}$ to the storage capacitor a on the side opposite from ground. The memory device further has column select lines $B_1$ to $B_m$ on which are respectively provided, from a column decoder 5, column select signals $H_1$ to $H_m$ which are represented by the binary terms. The column select line $B_i$ (where i=1 to m) is connected to gate circuits $I_i$ and $L_i$, as described later. The memory device includes word lines $C_1$ to $C_n$ on which are respectively provided word select signals $G_1$ to $G_n$ from a row decoder including a word driver 4. The word line $C_j$ (where j=1 to n) is connected to the gate of the FET c of the gate circuit b of each of the memory cells $M_{1j}$ to $M_{mj}$.

Figure 2:
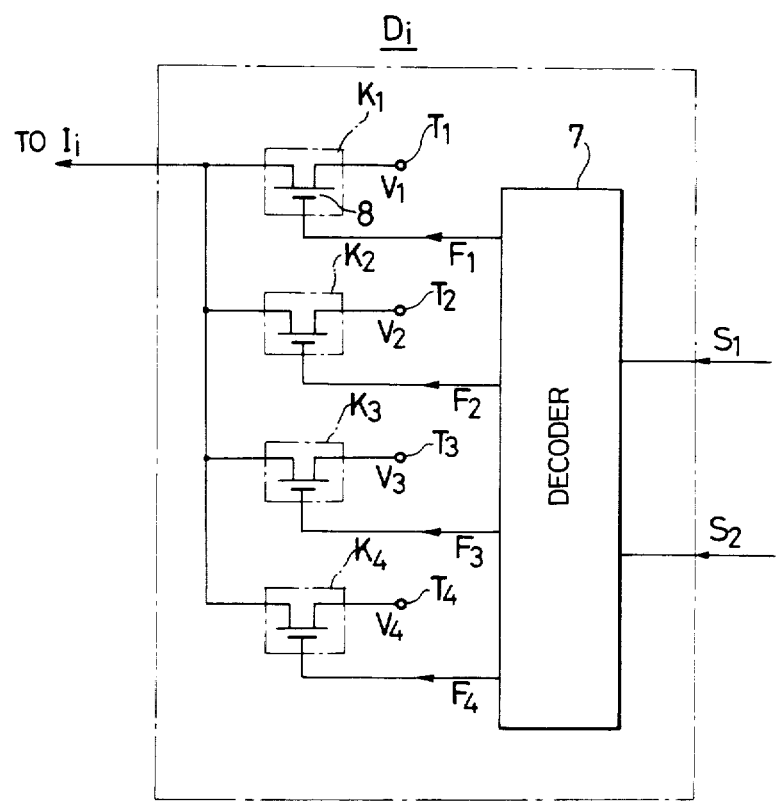
FIG. 2 is a connection diagram showing an example of the write circuit $D_i$ in FIG. 1.
Figures 3, 4:
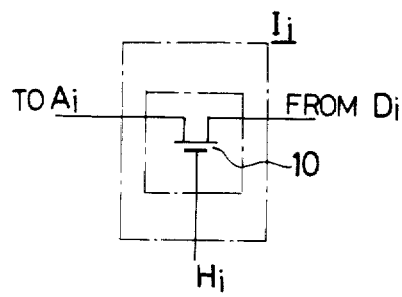
FIG. 3 is a table showing the relationships of various data for explaining the present invention.
FIG. 4 is a connection diagram showing an example of a gate circuit $I_i$.

The memory device also has m write circuits $D_1$ to $D_m$ and m gate circuits $I_1$ to $I_m$. The write circuit $D_i$ has an arrangement such, for example, as shown in FIG. 2. Incidentally, the following will describe the present invention in a generalized form, but FIG. 2 shows the case where q=4 and p=2. The write circuit $D_i$ includes a decoder 7 and q gate circuits $K_1$ to $K_q$ each formed by a FET 8. In this instance, the decoder 7 is a known one that receives p-bit (where $p \leq 2$) binary data ($S_1$ to $S_p$) from a binary data input/output circuit 6 and converts the binary data ($S_1$ to $S_p$) to digital signals ($F_1$ to $F_q$) (where $2^P \leq q \leq 3$) corresponding to q-level information. In this case, however, the digital signals ($F_1$ to $F_q$) corresponding to the q-level information will have, in accordance with $2^P$ different contents of the binary data ($S_1$ to $S_p$), q different contents such that only one of the q-bit data $F_1$ to $F_q$ is a "1" and the others "0"s, that is, ("1", "0", "0", . . . "0"), ("0", "1", "0", . . . "0"), . . . and ("0", "0", "0", . . . "1"). For instance, in the case where the p-bit binary data ($S_1$ to $S_p$) is two-bit binary data ($S_1$, $S_2$), the digital signals ($F_1$ to $F_q$) corresponding to the q-level information are digital signals ($F_1$ to $F_4$) corresponding to quaternary information (where $q = 2^P = 4$) and the two-bit binary data ($S_1$, $S_2$) has four different contents ("0", "0") ("0", "1"), ("1", "0") and ("1", "1"), the digital signals ($F_1$ to $F_4$) corresponding to the quaternary information will have four different contents such as, for example, ("1", "0", "0", "0"), ("0", "1", "0", "0"), ("0", "0", "1", "0") and ("0", "0", "0", "1"), as shown in FIG. 3. The gate circuits $K_1$ to $K_q$ of the write circuit $D_i$ respectively have power source terminals $T_1$ to $T_q$ connected to the source (or drain) of their FETs 8 on the input side of the gate circuit $I_i$. To the power source terminals $T_1$ to $T_q$ are respectively applied voltages $V_1$ to $V_q$ which have the following relationships: $V_1 < V_2 < V_3 \ldots < V_q$.

The gate circuit $I_i$, as shown in FIG. 4, is formed by a FET 10 which connects the output end of the write circuit $D_i$ to the data line $A_i$ when the column select signal $H_i$ provided on the column select line $B_i$ is a "1". Since the digital signals ($F_1$ to $F_q$) corresponding to the q-level information in the write circuit $D_i$ have q different contents, as referred to above, only a selected one of the q voltages $V_1$ to $V_q$ is supplied to the input side of the gate circuit $I_i$. Incidentally, the relationships between the digital signals ($F_1$ to $F_q$) corresponding to the q-level information, the voltages $V_1$ to $V_q$ and the p-bit binary data ($S_1$ to $S_p$) are shown in FIG. 3 assuming tht q=4 and p=2. When the FET 10 of the gate circuit $I_i$ is supplied at the gate with the column select signal $H_i$ at the "1" level from the column select line $B_i$, the gate circuit $I_i$ provides a selected one of the input voltages $V_1$ to $V_q$ to the data line $A_i$.

Figure 5:
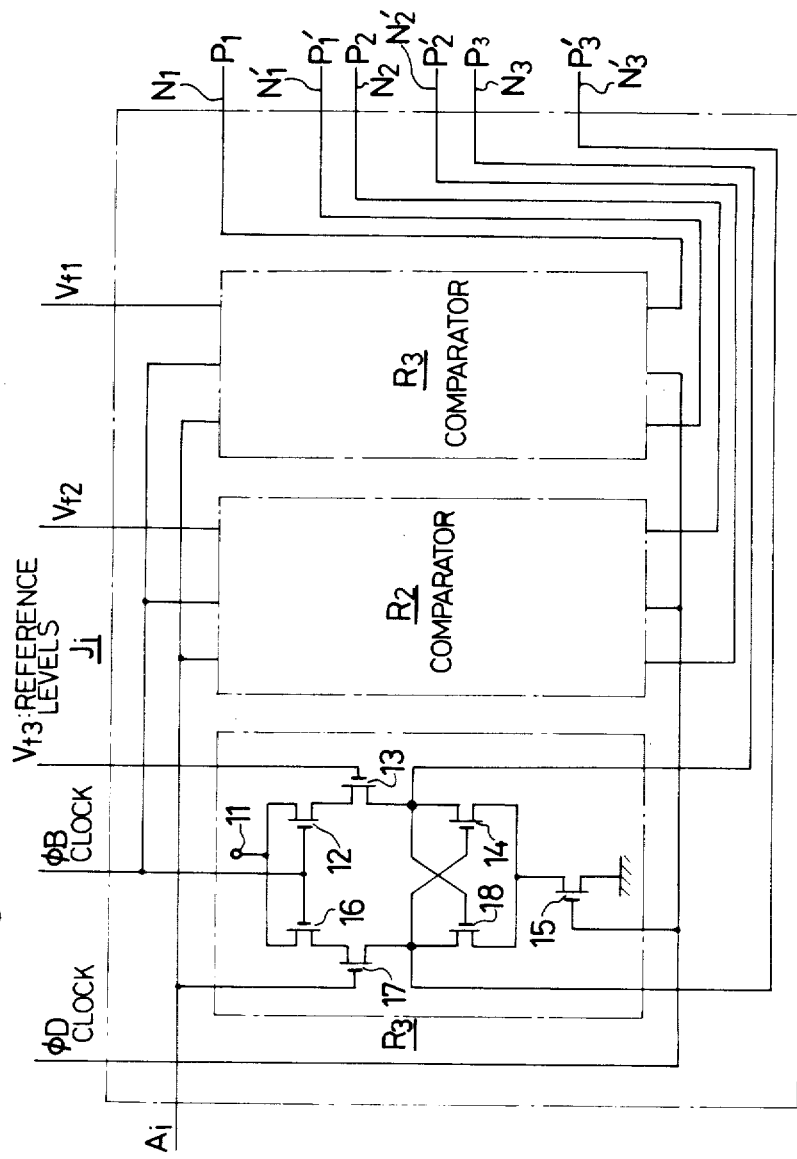
FIG. 5 is a connection diagram showing an example of a multilevel detector $J_i$.

The memory device of the present invention further has m multilevel detectors $J_1$ to $J_m$, m gate circuits $L_1$ to $L_m$ and m encoders $Q_1$ to $Q_m$. The multilevel detector $J_i$ has, for example, an arrangement as shown in FIG. 5. The following will describe the multilevel detector $J_i$ in a generalized form, while FIG. 5 illustrates a case where q=4. In the case of reading out q-level information, the multilevel detector $J_i$ has (q−1) comparators $R_1$ to $R_{(q-1)}$. The comparator $R_k$ (where k=1, 2, . . . (q−1)) has an arrangement in which a parallel circuit, including a series circuit composed of FETs 12, 13 and 14 connected in series in that order and a series circuit composed of FETs 16, 17 and 18 connected in series in that order, is connected in series to a FET 15 between a power source terminal 11 and ground. The FETs 12 and 16 are each supplied at their gates with a clock signal $\phi B$ which goes to a "1" and a "0" alternately. The gate of the FET 17 is connected to the data line $A_i$. To the gate of the FET 15 is applied a clock signal $\phi D$ which goes to a "1" and a "0" alternately. Furthermore, the gates of the FETs 13 of the comparators $R_1$ to $R_{(q-1)}$ are respectively supplied with reference voltages $V_{f1}, V_{f2}, \ldots$ and $V_{f(q-1)}$ which are reference levels.

Now, let it be assumed that one of the voltages $V_1$ to $V_q$, i.e. the q-level information, is available on the data line $A_i$. By preselecting the reference voltages $V_{f1}, V_{f2}, \ldots$ and $V_{f(q-1)}$ intermediate between the voltages $V_1$ and $V_2$, between $V_2$ and $V_3$, . . . and between $V_{q-1}$ and $V_q$, respectively, by forcing the above-mentioned clock signals $\phi B$ to the "0" state and the clock signal $\phi D$ to the "1" state and then returning the clock signal $\phi B$ to the "1" state, (q−1)-bit binary data ($P_1$ to $P_{(q-1)}$) is yielded on output lines $N_1$ to $N_{(q-1)}$ from nodes of the FETs 13 and 14 of the comparators $R_1$ to $R_{(q-1)}$ and negative logic of binary data ($p_1'$ to $P_{(q-1)}'$) of the (q−1)-bit binary data ($P_1$ to $P_{(q-1)}$) is provided on output lines $N_1'$ to $N_{(q-1)}'$ from the FETs 17 and 18. These two types of binary data will hereinafter be referred to as the sense circuit output signals. The contents of the sense circuit output signals, i.e. the binary data ($P_1$ to $P_{(q-1)}$) and the binary data ($P_1'$ to $P_{(q-1)}'$) and the voltage $V_1$ to $V_q$ have relationships as shown in FIG. 3.

Figure 6:
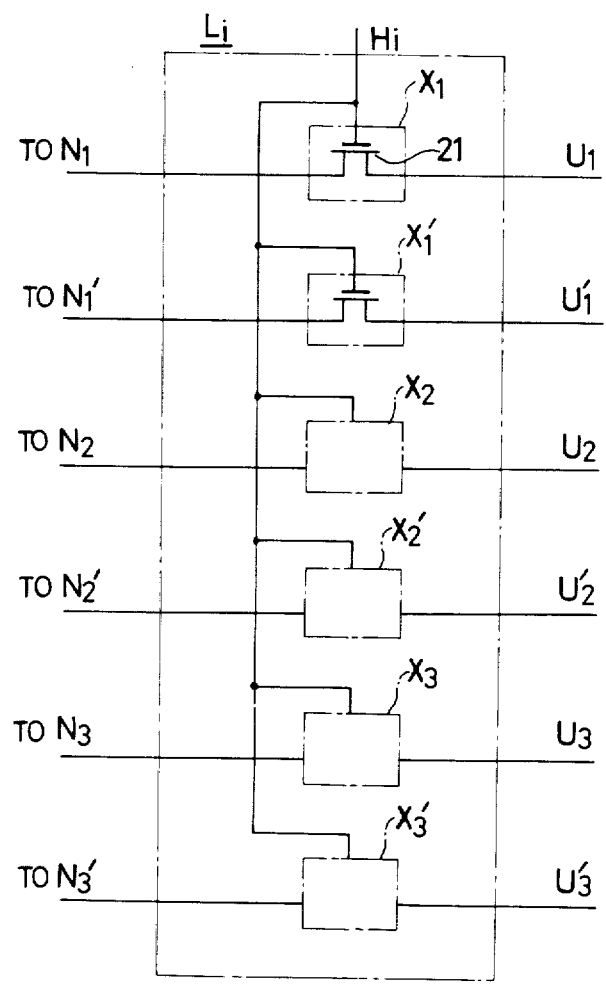
FIG. 6 is a connection diagram showing an example of a gate circuit $L_i$.

The gate circuit $L_i$ comprises pairs of gate circuits $X_1$ and $X_1'$, $X_2$ and $X_2'$, . . . and $X_{(q-1)}'$, as shown in FIG. 6 which exemplifies the case where q=4. The gate circuits $X_1$ and $X_1'$, $X_2$ and $X_2'$, . . . and $X_{(q-1)}$ and $X_{(q-1)}'$ connect the output lines $N_1$ and $N_1'$, $N_2$ and $N_2'$, . . . and $N_{(q-1)}$ and $N_{(q-1)}'$ of the multilevel detector $J_i$ to input lines $U_1$ and $U_1'$, $U_2$ and $U_2'$, . . . $U_{(q-1)}$ and $U_{(q-1)}'$ of the encoder $Q_i$, respectively. The gate circuits $X_1$ to $X_{(q-1)}'$ are formed by, for instance, FETs 21 and are turned ON by the column select signal $H_i$ available from the column select line $B_i$.

Figure 7:
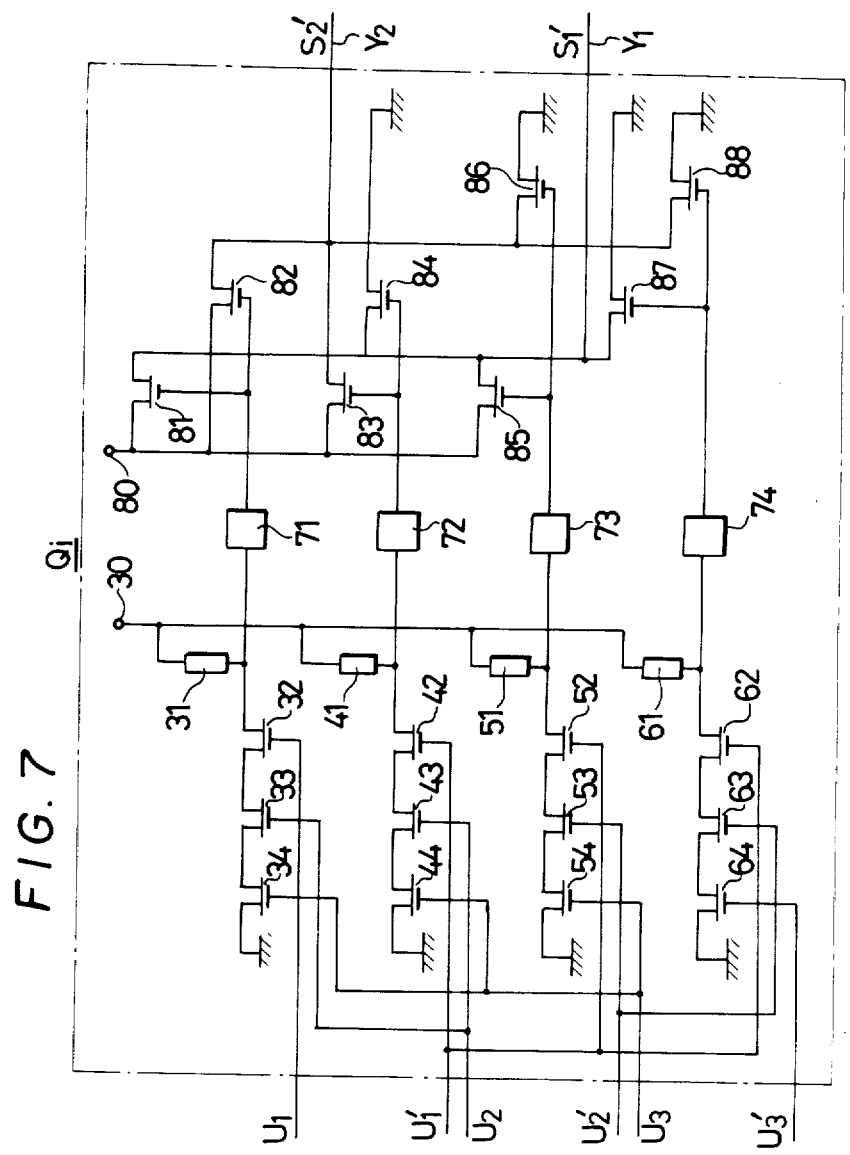
FIG. 7 is a connection diagram showing an example of an encoder $Q_i$.

The encoder $Q_i$ has an arrangement as shown in FIG. 7 which exemplifies the case where q=4. Between a power source terminal 30 and ground are connected a series circuit of FETs 32, 33 and 34 via a resistor 31, a series circuit of FETs 42, 43 and 44 via a resistor 41, a series circuit of FETs 52, 53 and 54 via resistor 51 and a series circuit of FETs 62, 63 and 64 via a resistor 61. Between a power source terminal 80 and the ground are similarly connected a series circuit of FETs 81 and 84, a series circuit of FETs 81 and 87, a series of FETs 82 and 86, a series circuit of FETs 82 and 88, a series circuit of FETs 83 and 86, a series circuit of FETs 83 and 88, a series circuit of FETs 85 and 87 and a series circuit of FETs 85 and 84. The input lines $U_1$, $U_1'$, $U_2$, $U_2'$, $U_3$ and $U_3'$ are connected to the gate of the FET 32, the gates of the FETs 42, 52 and 62, the gates of the FETs 33 and 43, the gates of the FETs 53 and 63, the gates of the FETs 34, 44 and 54 and the gate of the FET 64, respectively.

Those ends of the resistors 31, 41, 51 and 61 on the opposite side from the power source terminal 30 are connected to the gates of the FETs 81 and 82 via an inverter 71, the gates of the FETs 83 and 84 via an inverter 72, the gates of the FETs 85 and 86 via an inverter 73 and the gates of the FETs 87 and 88 via an inverter 74, respectively. Moreover, the connection point of the FETs 81, 84, 85 and 87 is connected via an output line $Y_1$ to the binary data input/output circuit 6 and the connection point of the FETs 82, 83, 86 and 88 is connected via an output line $Y_2$ to the binary data input/output circuit 6. With an encoder $Q_i$ of such an arrangement, binary data $S_1'$ amd $S_2'$, which represents the sense circuit output signals available from the gate circuit $L_i$, that is, the (q−1)-bit binary data ($P_1$ to $P_{(q-1)}$) and $P_1'$ to $p_{(q-1)}'$), are provided on output lines $Y_1$ and $Y_2$, respectively. The binary data $S_1'$ and $S_2'$ are identical with the previously-mentioned binary data.

The memory device of the present invention further has precharge circuits $W_1$ to $W_m$. Each precharge circuit $W_i$, (where i=1 to m) though not illustrated, has a gate circuit formed of a FET, and a power source terminal, at which a precharging voltage is obtained by the application of a clock signal $\phi R$ to the FET, is connected via another FET to the data line $A_i$.

Figure 8:
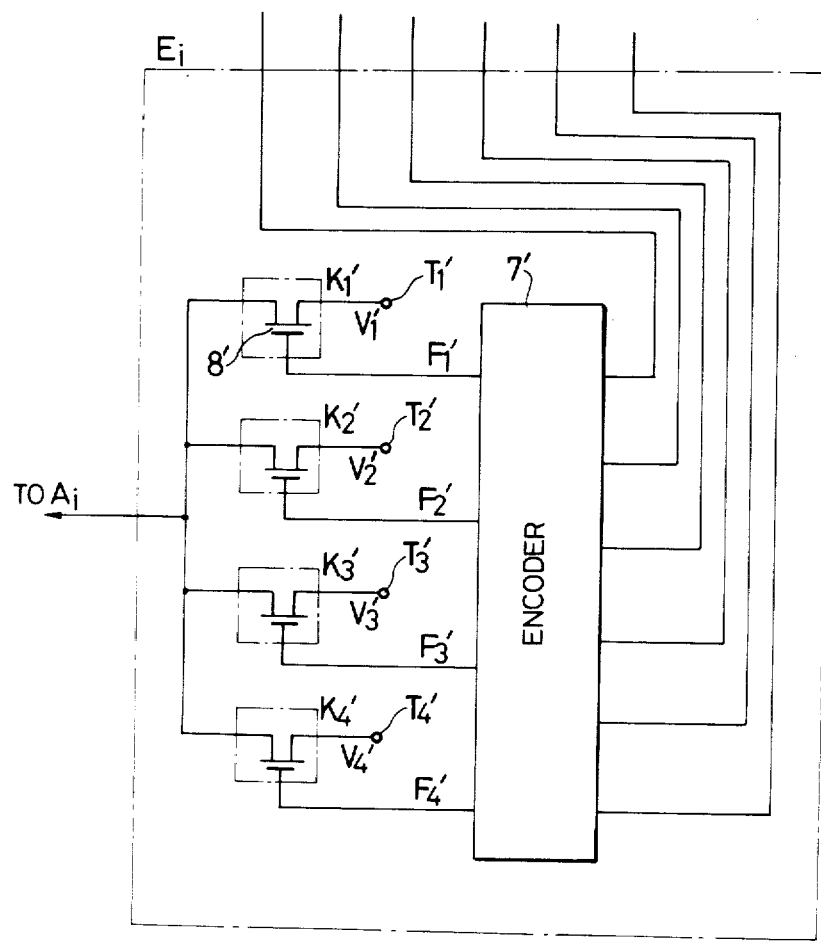
FIG. 8 is a connection diagram showing an example of a refresh circuit Ei for restorage.

The memory device of the present invention further has refresh circuits $E_1$ to $E_m$. The refresh circuit $E_i$ (where i=1 to m) has an arrangement such, for instance, as depicted in FIG. 8. Incidentally, the following will describe the refresh circuit in a generalized form, but FIG. 8 shows the case where q=4. As illustrated in FIG. 8, the refresh circuit $W_i$ comprises an encoder 7' and q gate circuits $K_1'$ to $K_q'$, each formed of a FET. The encoder 7' is a known type and converts the (q−1)-bit binary data ($P_1$ to $P_{(q-1)}$) from the comparator $J_i$ to q different digital signals ($F_1'$ to $F_q'$) corresponding to the q-level information. In ("0", "0", "1", "0") and ("0", "0", "0", "1"), which are the same as the four different contents of the digital signals ($F_1$ to $F_4$) corresponding to the quaternary information obtainable with the encoder 7 of the write circuit $D_i$. The gate circuits $K_1'$ to $K_q'$ of the refresh circuit $E_i$ connect power source terminals $T_1'$ to $T_q'$ to the data line $A_i$ when the q different digital signals ($F_1'$ to $F_q'$) corresponding to the q-level information are applied to the gates of the FETs 8', respectively. The power source terminals $T_1'$ to $T_q'$ are respectively supplied with voltages $V_1'$ to $V_q'$ which have the relationship $V_1' < V_2'$, . . . and $V_{(q-1)}' < V_q'$ as is the case with the voltages $V_1$ to $V_q$. Since the q kinds of digital signals ($F_1'$ to $F_q'$) corresponding to the q-level information have q different contents in that any one of the bits $F_1'$ to $F_q'$ is a "1" and the others "0"s, only a selected one of the q voltages $V_1'$ to $V_q'$ (the q-level information) is applied to the data line $A_i$. In this instance, the q voltages $V_1'$ to $V_q'$ correspond to the contents of the previously-mentioned p-bit information ($S_1$ to $S_p$), respectively.

With a memory device according to the present invention as described above, by applying the word select signal $G_j$ at the "1" level to the word select line $C_j$ alone from the row decoder including word driver 4, the gate circuits b of the memory cells $M_{1j}$ to $M_{mj}$ are turned ON, connecting the storage capacitors a of the memory cells $M_{ij}$ to $M_{jm}$ to the data lines $A_1$ to $A_m$. By applying the column select signals $H_i$ at the "1" level to the column select line $B_i$ alone from the column decoder 5, the gate circuit $I_i$ is turned ON.

Accordingly, by applying the p-bit binary data ($S_1$ to $S_p$) to the write circuit $D_i$ thereafter, q-level information corresponding to the p-bit binary data ($S_1$ to $S_p$) (in practical terms, one of q voltage levels) is provided from the write circuit $D_i$ at a value corresponding to the contents of the binary data ($S_1$ to $S_p$). The q-level information is stored in the storage capacitor a of the memory cell $M_{ij}$ via the data line $A_i$ and then via the gate circuit b of the memory cell $M_{ij}$.

By returning the word select signal $G_j$ from the "1" to the "0" state after storing the q-level information in the storage capacitor a of the memory call $M_{ij}$ as described above, the gate circuit b of the memory cell $M_{ij}$ is turned OFF, thereafter retaining the q-level information stored in the storage capacitor a of the memory cell $M_{ij}$.

When applying the clock signal $\phi R$ at the "1" level to the precharge circuit $W_i$ in the state in which the q-level information is being retained in the memory cells $M_{11}$ to $M_{1n}$, $M_{21}$ to $M_{2n}$, . . . and $M_{m1}$ to $M_{mn}$, the data lines $A_1$ to $A_m$ are precharged by the precharging voltage from the precharge circuit $W_i$.

By supplying the word select signal $G_j$ at the "1" level to the word select line $C_j$ alone from the row decoder including word driver 4 after the above operation, the gate circuits b of the memory cells $M_{1j}$ to $M_{mj}$ are turned ON, connecting their storage capacitors a to the data lines $A_1$ to $A_m$.

Accordingly, the multilevel detectors $J_1$ to $J_m$ are respectively supplied with the q-level information stored in the storage capacitors a of the memory cells $M_{1j}$ to $M_{mj}$. As a consequence, the multilevel detectors $J_1$ to $J_m$ provide the sense circuit output signals corresponding to the q-level information stored in the memory cells $M_{1j}$ to $M_{mj}$, that is, the (q−1)-bit binary data ($P_1$ and $P_1'$, $P_2$ and $P_2'$, . . . and $P_{(q-1)}$ and $P_{(q-1)}'$).

Applying the column select signal $H_i$ at the "1" level to the column select line $B_i$ alone from the column decoder (a column select circuit) 5 after the above operation, only the gate circuit $L_i$ is turned ON, encoding the information from the multilevel detector $J_i$ by the encoder $Q_i$. Accordingly, p-bit binary data ($S_1'$ to $S_p'$) representing the multilevel information stored in the memory cell $M_{ij}$ is obtained on the basis of the (q−1)-bit binary data available from the multilevel detector $J_i$, and is supplied to the binary data input/output circuit 6.

Furthermore, when applying the clock signal $\phi R$ at the "1" level to the precharge circuit $W_i$ and then applying the word select signal $G_j$ at the "1" level to the word select line $C_j$ from the row decoder including word driver 4 in the state in which the q-level information is being stored in the memory cells $M_{11}$ to $M_{1n}$, $M_{21}$ to $M_{2n}$, . . . and $M_{m1}$ to $M_{mn}$, as described above, the multilevel detector $J_i$ outputs (q−1)-bit binary data representing the q-level information stored in the memory cells $M_{1j}$ to $M_{mj}$, as described above.

On the other hand, the refresh circuits $E_1$ to $E_m$ respectively create q-level information of the same contents as the q-level information stored in the memory cells $M_{1j}$ to $M_{mj}$ on the basis of the binary data from the multilevel detector $J_i$ (where i=1 to m). The q-level information thus obtained is rewritten in the memory cells $M_{1j}$ to $M_{mj}$ via the data line $A_1$ to $A_m$, respectively.

While in the above the gate circuit $L_i$ is interposed between the multilevel detector $j_i$ and the encoder $Q_i$, the gate circuit $L_i$ can also be built in the encoder $Q_i$.

Figure 9:
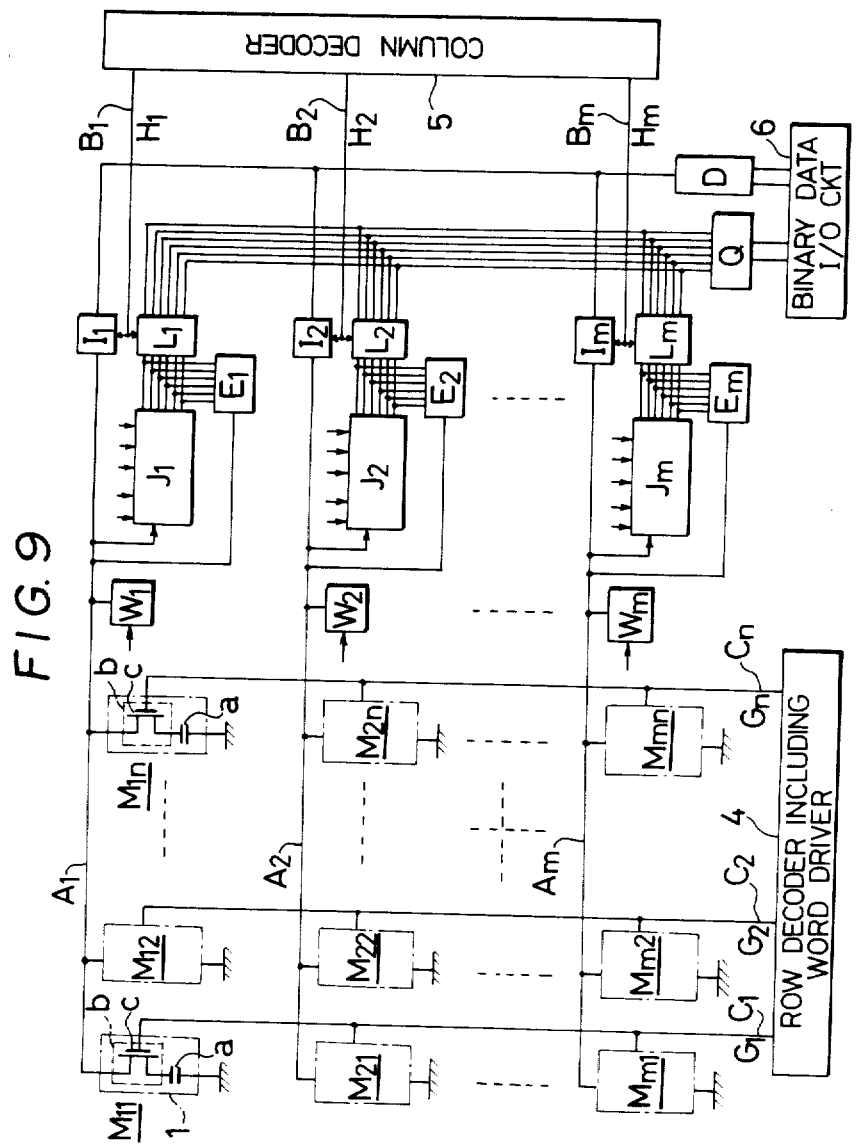
FIG. 9 is a connection diagram illustrating another embodiment of the memory device of the present invention.

Moreover, the foregoing description has been provided in connection with a case where the m write circuits $D_1$ to $D_m$ and the m encoders $Q_1$ to $Q_m$ are provided, but the write circuits may also be replaced with one write circuit D which is common to the data lines $A_1$ to $A_m$, and the encoders may also be substituted for with one encoder Q, as depicted in FIG. 9. Furthermore, it is also possible to provide a common write circuit D in place of the write circuits $D_1$ to $D_m$ and a common encoder in place of the encoders $Q_1$ to $Q_m$.

The foregoing has described the entire system of the memory device of the present invention. Next, a description will be given of an embodiment of a sense circuit which is suitable for use as the comparator $R_i$ which is employed in the multilevel detector $J_i$ which is important for achieving high-speed memory operation.

Since the multilevel detector for use in the memory device of the present invention is arranged to detect the multilevel (q-level) information at one time through use of its internal comparators $R_1$ to $R_{q-1}$ as described previously, the signal voltage of the data line is connected in common to the sense circuits. Therefore, it is required that the signal voltage of the data line which is applied to the sense circuits be retained and the sense circuits operate correctly. To meet this requirement, it is desirable to use a sense circuit of a type in which the input node and the output node are separated from each other.

Figure 10:
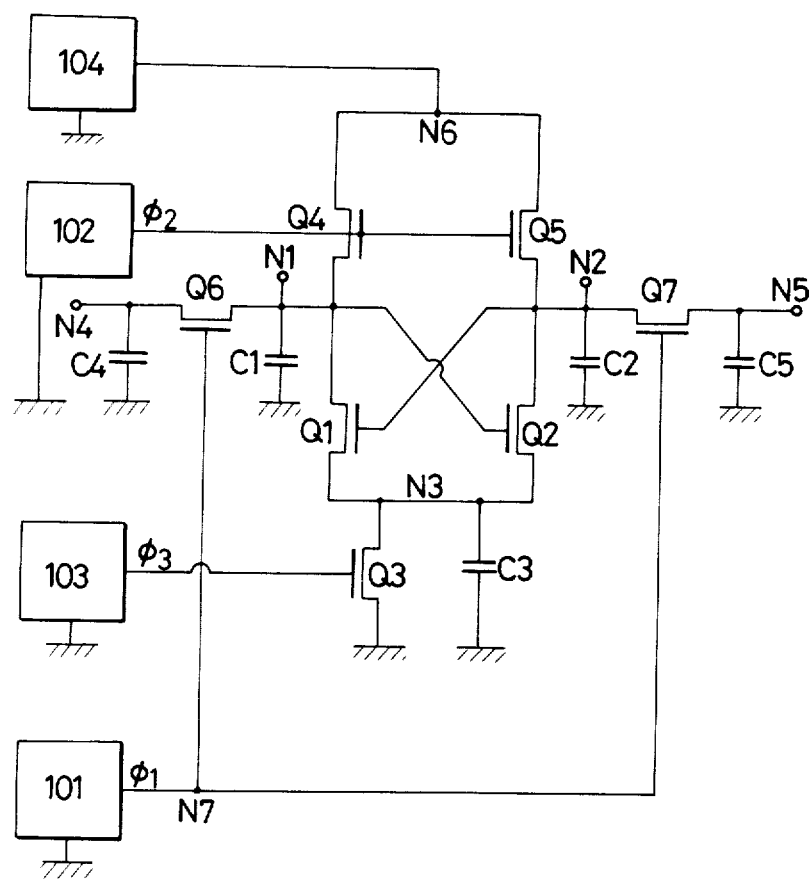
FIG. 10 is a connection diagram showing an example of the arrangement of a sense circuit for use in the present invention.

The sense circuit in which the input node and the output node are separated from each other has an arrangement such, for example, as shown in FIG. 10. In FIG. 10, reference characters Q1 to Q7 indicate MOS transsistors N1 to N6 first to sixth nodes, C1 to C5 capacitances formed between the nodes and the ground, 101 to 103 clock signal generators which generate clock signals $\phi_1$ to $\phi_3$ for driving the sense circuit and 104 a positive power source of a voltage $V_{DD}$. Let it be assumed that the capacitances C1 and C2, C4 and C5 respectively have the same capacitance values, and that the clock signals have two states of "L" and "H" levels. Since it is necessary to turn OFF an n-channel MOS transistor, also assume that the "L" level is the ground potential. Further, since the highest potential that is transmitted via the MOS transistors is the potential $V_{DD}$ at the common node N6 connected to the positive power source 104, let it be assumed that the "H" level is a fixed potential which satisfies the following equation:

"H" level $\geq V_{DD} + V_{th\,(n-ch)}$ where $V_{th\,(n-ch)}$ is the threshold voltage of the n-channel MOS transistors.

Now, let it be assumed that in the initial state the clock signals $\phi_1$ and $\phi_2$ of the sense circuit shown in FIG. 10 are at the "H" level and the clock signal $\phi_3$ at the "L" level, the capacitances C1 to C5 formed between the nodes and the ground are charged by the power source 104 via the MOS transistors Q1, Q2 and Q4 to Q7 and the nodes N1 and N2, N4 and N5 are set at an equipotential, respectively.

At first, the clock signal $\phi_2$ is made "L"-level, disconnecting the power source 104 from the sensed output nodes N1 and N2. Then input signals the potential difference of which is to be detected are applied to the input nodes N4 and N5 via gate circuits or the like. By this, the capacitances C4 and C5 of the input nodes and the capacitances C1 and C2 of the sensed output nodes are charged and discharged, providing at the sensed output nodes N1 and N2 potentials equal to those at the input nodes N4 and N5.

Figure 11:
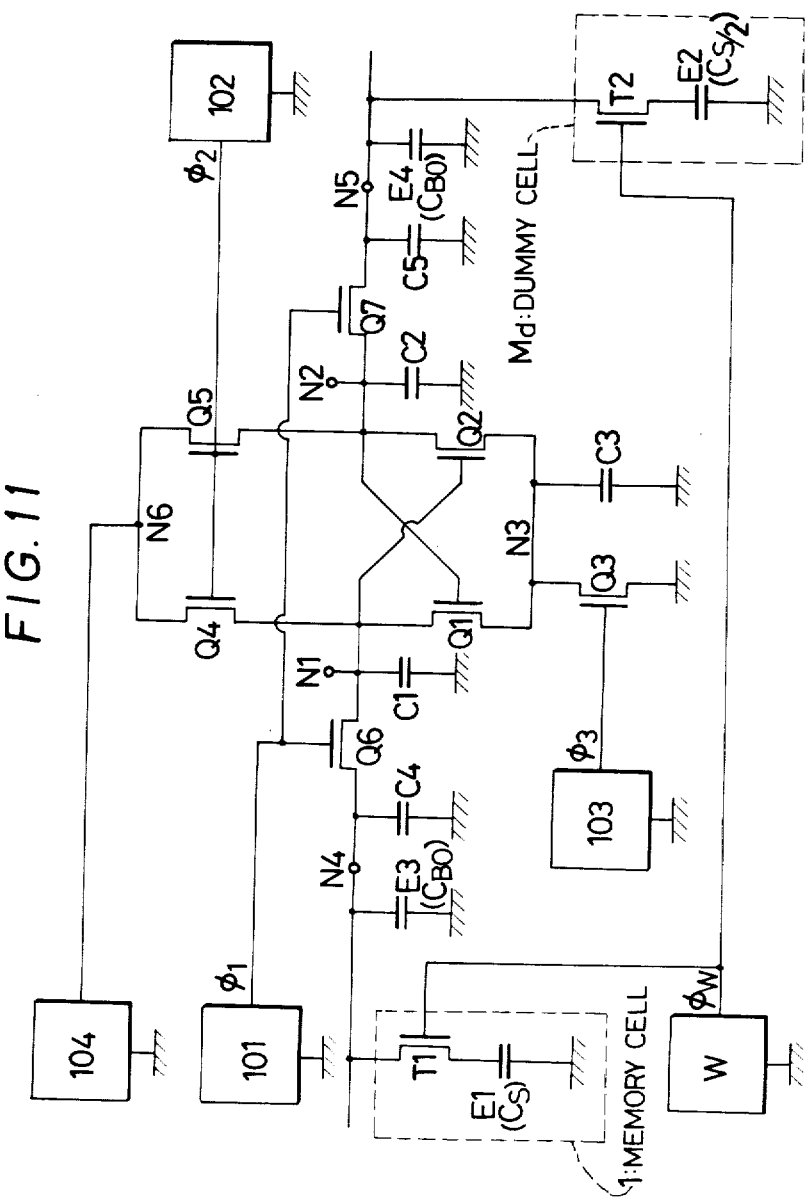
FIG. 11 is a connection diagram showing an example of the application of the sense circuit to a memory cell sense circuit.

FIG. 11 illustrates an example in which information from a memory cell 1 (corresponding to $M_{ij}$ in FIG. 1) including one n-channel MOS transistor (corresponding to the gate circuit b in FIG. 1) and one capacitance (corresponding to the storage capacitor in FIG. 1) is detected through use of the circuit depicted in FIG. 10. In FIG. 11, reference characters T1 and T2 indicate n-channel MOS transistors, E1 a memory cell capacitance, E2 a dummy cell capacitance, E3 and E4 capacitances (parasitic) formed between the data line and the ground and W a select signal generator which creates a select signal $\phi_w$ for selecting a pair of a memory cell $M_{ij}$ and a dummy cell $M_d$. The select signal $\phi_w$ is at the "L" level when the memory cell is not selected. The memory cell capacitance has a capacitance value $C_s$ and has two states, the $V_{DD}$ potential and the ground potential. In order to detect information in the memory cell, the dummy cell is provided which comprises an n-channel MOS transistor gate and a dummy cell capacitance which has a capacitance value $C_s/2$ and one state, the ground potential.

Many memory cell capacitances and one dummy cell capacitance are connected to a common line (corresponding to the data line $A_i$ in FIG. 1) called a bit line or data line via gate circuits formed by n-channel MOS transistors. The terminating end of the data line is connected to the input node (N4 or N5) shown in FIG. 10 or 11. The data line is formed of a pair of data lines connected to the input nodes N4 and N5, respectively. When one memory cell on the data line connected to one of the input nodes is selected, a dummy cell is selected on the data line connected to the other input node. In the example shown in FIG. 11 the memory cell capacitance E1 on the data line connected to the input node N4 and the dummy cell capacitance E2 on the data line connected to the input node N5 are selected. The capacitances E3 and E4 formed between the data lines and the ground both have a capacitance value $C_{B0}$. The sume of the capacitance value $C_{B0}$, the capacitance value at one of the input nodes and the capacitance value at one of the sensed output nodes will hereinafter be identified by $C_B$ and referred to as a data line capacitance.

The pair of data lines are set to the initial potential $V_{DD}$ as is the case with the input nodes. When a pair of a memory cell and a dummy cell are selected, the select signal $\phi_w$ goes to the "H" level, opening paths from the memory cell capacitance and the dummy cell capacitance to the respective data lines. In the case where the memory cell capacitance has the $V_{DD}$ potential in the initial state, since no charge transfer takes place between the data line capacitance and the memory cell capacitance, the potential V4 at the input node remains at $V_{DD}$. When the memory cell capacitance has the ground potential in the initial state, a charge transfer from the data line capacitance to the memory cell capacitance will occur. The potential V4 at the input node N4 upon completion of the charge transfer is given by the following equation:

$$V4 = V_{DD}\frac{C_B}{C_B + C_S} \approx V_{DD} - 2V_{sig}$$

where $$V_{sig} = \frac{C_S/2}{C_B + C_S} \cdot V_{DD}$$

On the other hand, the dummy cell capacitance initially has the ground potential and has a capacitance value one-half that of the memory cell, so that when the path from the dummy cell to the data line is opened, a charge transfer from the data line to the dummy cell occurs. The potential V5 at the input node N5 is given by the following equation:

$$V5 = V_{DD}\frac{C_B}{C_B + C_S/2} \approx V_{DD} - V_{sig}$$

This approximation holds when $C_B$ is much greater than $C_S$, and assumes a substantially intermediate value of the output potential of the memory cell. By detecting the potential difference between the output potentials in the memory cell and the dummy cell read out onto the pair of data lines, information of the memory cell (the $V_{DD}$ potential or the ground potential) is sensed.

After a potential reflecting the potential difference between the input nodes N4 and N5 appears between the sensed output nodes N1 and N2, the clock signal $\phi_1$ from the clock signal generator 101 is forced to the "L" level to disconnect the input nodes N4 and N5 from the sensed output nodes N1 and N2 and then the clock signal $\phi_3$ from the clock signal generator 103 is forced to the "H" level, thereby discharging the capacitances C1 to C3 via the MOS transistors Q1 to Q3. In the case where the signal on the data line to which the memory cell is connected and the signal on the data line to which the dummy cell is connected are applied to the input nodes N4 and N5, respectively, letting the potentials at the input node N4, the sensed output node N1, the input node N5 and the sensed output node N2 be represented by V4, V1, V5 and V2, they bear such relationships as V4=V1=$V_{DD}$ and V5=V2 $V_{DD}$−$V_{sig}$, for instance.

When the potential V1 at the node N1 is higher, though slightly, than the potential V2 at the node N2, the capacitance C2 is discharged faster than the capacitance C1, due to the difference between source-gate voltages of the MOS transistor Q1 and Q2, and the MOS transistor Q1 is turned OFF, stopping the discharge of the capacitance C1. The lowering of the potential at the output node N1 terminates with this, but the potential at the output node N1 remains higher than the threshold voltage $V_{th(n-ch)}$ of the n-channel MOS transistor. Because this, the MOS transistor Q2 remains in the ON state, discharging all charge stored in the capacitance C2 connected between the output node N2 and the ground. Since the potential at the output node N2 eventually drops down to the ground potential, the potential difference between the sensed output nodes N1 and N2 is enlarged. Incidentally, since the input nodes N4 and N5 are increased by the MOS transistors Q6 and Q7 in the OFF state from the sensed output nodes N1 and N2 before the MOS transistor Q3 is turned ON, the potentials of the initial input signals are maintained.

In the above sense circuit, however, since a clock is needed for turning OFF transistors which are inserted between the input nodes N4 and N5 and the sensed output nodes N1 and N2 for isolating them after the application of the input signals to the input nodes N4 and N5, a limitation is imposed on the high-speed operation from the application of the input nodes N4 and N5 to the output of the sensed signals at the sensed output nodes N1 and N2.

Next, a description will be given of a sense circuit which senses a small bit line signal at higher speed and hence is suitable for use as the comparator of the multilevel detector employed in the memory device of the present invention. An embodiment of a sense circuit will be described which permits faster detection of a small bit line signal through an arrangement in which the input nodes and the sensed output nodes are isolated from each other.

Figure 12:
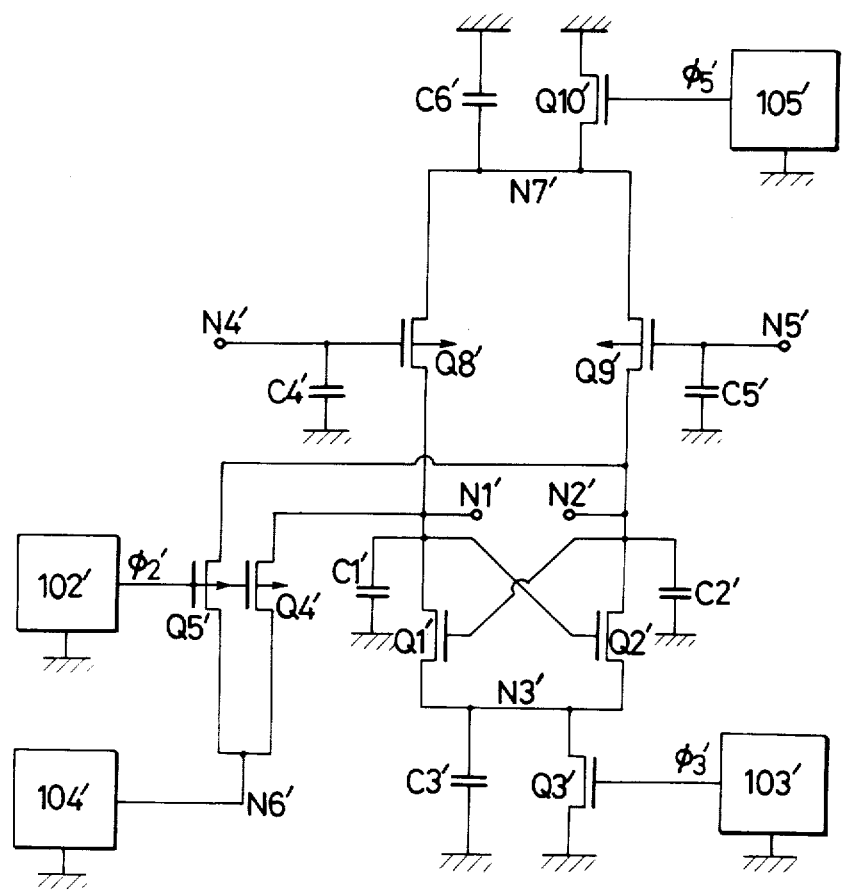
FIG. 12 is a circuit diagram illustrating an embodiment of an improved sense circuit in the present invention.
Figure 13:
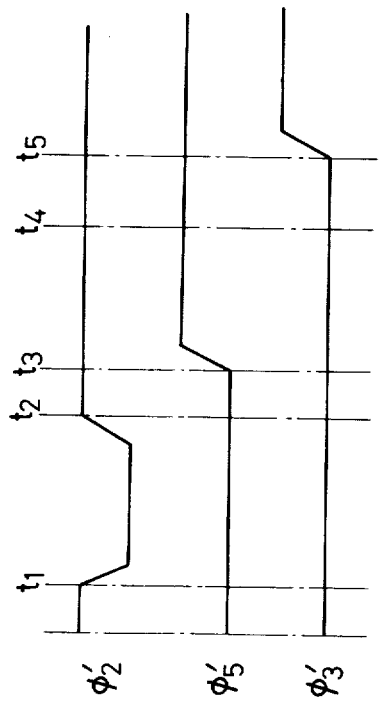
FIG. 13 is a timing chart for explaining clock signals in the sense circuit of FIG. 12.
Figure 14:
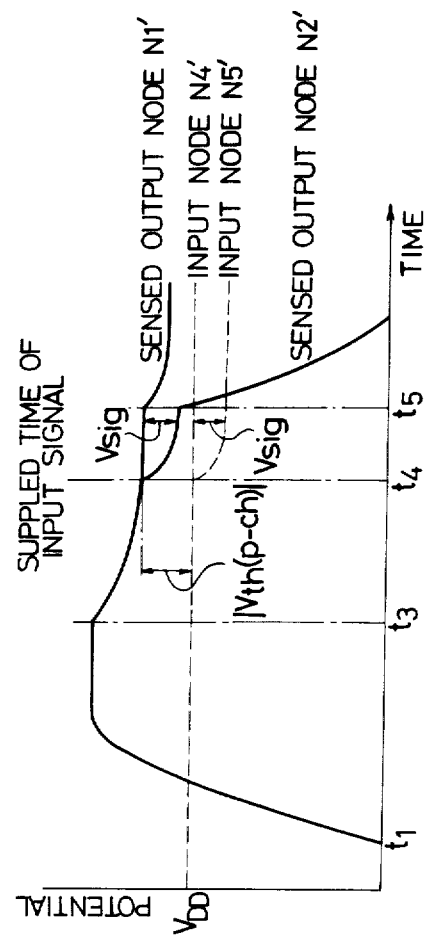
FIG. 14 is a graph showing examples of potential waveforms occurring at nodes $N_1$, $N_2$, $N_4$ and $N_5$ in FIG. 12.

FIG. 12 schematically illustrates the sense circuit which is suitable for use in the memory device of the present invention. In FIG. 12 reference characters Q1' to Q3' and Q10' indicate n-channel MOS transistors, Q4', Q5', Q8' and Q9' p-channel MOS transistors, N1' to N7' nodes, C1' to C6' capacitances formed between the resepctive nodes and the ground, 102', 103' and 105' clock signal generators, $\phi_2'$, $\phi_3'$ and $\phi_5'$ clock signals and 104' a positive power source. Let it be assumed that the capacitances C1' and C2', C4' and C5' respectively have the same capacitance values. Assume that, letting the initial set potentials at the input nodes N4' and N5' be represented by $V_{DD}$ and the threshold voltages of the p-channel MOS transistors be represented by $|V_{th(p-ch)}|$, the positive power source 104' has a voltage above $|V_{DD}+V_{th(p-ch)}|$. Assume that the clock signals have two states, "L" and "H" levels, that the "L" level is the lowest potential, i.e. the ground potential, for turning OFF the n-channel MOS transistors and ON the p-channel MOS transistors, and that the "H" level is the highest potential, i.e. the same potential as that of the power source 104', for turning OFF the p-channel MOS transistors and ON the n-channel MOS transistors. FIG. 13 shows, by way of example, timing charts of the clock signals $\phi_2'$, $\phi_3'$ and $\phi_5'$ and FIG. 14 shows examples of potential waveforms at the input nodes N4' and N5' and the sensed output nodes N1' and N2'.

Now, let it be assumed that the input nodes N4' and N5' are initialized at the potential $V_{DD}$ via gate circuits or the like, that the capacitances C1' and C2' defined between the sensed output nodes N1' and N2' and the ground and the capacitances C3' and C6' between the common nodes N3' and N7' are charged by the charge supplied from the power source 104' via the MOS transistors Q4' and Q5', Q1' and Q2' and Q8' and Q9', respectively, that the sensed output nodes N1' and N2' are equally set to the potential of the power source 104' and that the clock signals $\phi_2'$, $\phi_3'$ and $\phi_5'$ are all at the "L" level.

At first, the clock signal $\phi_2'$ from the clock signal generator 102' is forced to the "H" level, disconnecting the power source 104' from the sensed output nodes N1' and N2'. Then the clock signal $\phi_5'$ is forced to the "H" level, thereby turning ON the MOS transistor Q10' to open a path from the common node N7' to the ground. The p-channel MOS transistor Q8' remains in the ON state while its source-gate voltage exceeds the threshold voltage $|V_{th(p-ch)}|$ of the p-channel MOS transistor, and the charge stored in the capacitance C1' between the node N1' and the ground is discharged via the MOS transistors Q8' and Q10'. This discharge automatically stops when the potential at the sensed output node N1' drops to a potential higher than the potential $V_{DD}$ at the input node N4' by the threshold voltage $|V_{th(p-ch)}|$ of the p-chanel MOS transistor, that is, down to the potential $V_{DD}+|V_{th(p-ch)}|$, turning OFF the MOS transistor Q8'. This applies to the sensed output node N2' and the MOS transistor Q9'. Since the input nodes N4' and N5' are both initialized to the potential $V_{DD}$, the sensed output nodes N1' and N2' are both automatically set to the potential $V_{DD}+|V_{th(p-ch)}|$.

Next, signals, the potential difference of which is to be detected, are applied to the input nodes N4' and N5' via gate circuits or the like. For example, a signal on the data line to which the memory cell is connected (corresponding to the signal on the data line $A_i$ in FIG. 5) is applied to the input node N4' and a signal on the data line to which the dummy cell is connected (corresponding to the reference voltages $V_{f1}$, $V_{f2}$ or the like in FIG. 5) is applied to the input node N5', as described previously in connection with FIG. 10. Let the potentials at the input nodes N4' and N5' after the application of the input signals be represented by $V_{DD}$ and $V_{DD}-V_{sig}$, respectively. Since the source-gate voltage of the MOS transistor Q9' exceeds the threshold voltage $|V_{th(p-ch)}|$ of the p-channel MOS transistor by $V_{sig}$ due to the decrease in the potential at the input node N5' by $V_{sig}$, the MOS transistor Q9' is turned ON, by which the charge stored in the capacitance C2' between the sensed output node N2' and the ground is discharged via the MOS transistors Q9' and Q10', causing the potential at the sensed output node N2' to drop a potential higher than the potential at the input node N5' by the threshold voltage $|V_{th(p-ch)}|$ of the p-channel MOS transistor. That is to say, if the source potential dependence of the threshold voltage is neglected, when the source voltage drops by $V_{sig}$, the transsitor will be turned OFF again. Thus the potential difference $V_{sig}$ between the input nodes N4' and N5' is reflected as the potential difference $V_{sig}$ between the sensed output nodes N1' and N2'. Letting the potentials at the input nodes N4' and N5' be represented by V4 and V5, the potentials at the sensed output nodes N1' and N2' by V1 and V2 and the threshold voltage of the p-channel MOS transistor by $|V_{th(p-ch)}|$, the following equations apply between the relationship of V4 and V1 and between V5 and V2 in the balanced state:

$$V1 = V4 + |V_{th(p-ch)}| \text{ and } V2 = V5 + |V_{th(p-ch)}|.$$

In the above example, since $V_4=V_{DD}$ and $V_5=V_{DD}-V_{sig}$, it follows that $V1=V_{DD}+|V_{th(p-ch)}|$ and $V2=V_{DD}+|V_{th(p-ch)}|-V_{sig}$, and when the source potential dependence of the threshold voltage is neglected, the potential V1 at the sensed output node N1' is higher than the potential V2 at the sensed output node N2' by $V_{sig}$.

When raising the clock signal $\phi_3'$ of the clock signal generator 103' to open the path from the common node N3' to the ground in the state in which the potential difference $V_{sig}$ between the input nodes N4' and N5' is sufficiently reflected between the sensed output nodes N1' and N2', the potential at the common node N3' drops to the ground potential. At this time, the n-channel MOS transistors Q1' and Q2' of the same conductivity type are turned ON if their source-gate potentials, i.e. the potentials at the sensed output nodes N2' and N1', exceed the threshold voltage of the n-channel MOS transistor. Here, since it is intended to enlarge the potential difference between the sensed output nodes, assume that the potential $V_{DD}$ at the input nodes N4' and N5' in the initial state is selected so that at least one of the MOS transistors Q1' and Q2' is turned ON.

In the above example, let it be assumed that when the clock signal $\phi_3'$ goes to the "H" level and the potential at the common node N3' drops to the ground potential, the potentials at the sensed output nodes N1' and N2' exceed the threshold voltage of the n-channel MOS transistor. The n-channel MOS transistors Q1' and Q2' are both turned ON, by which the charge stored in the capacitance C1' between the sensed output node n1' and the ground is discharged via the MOS transistors Q;' and Q3' and charge stored in the capacitance C2' between the sensed output node N2' and the ground is also dischaged via the MOS transistors Q2' and Q3'. If the potential at the sensed output node N1' is higher than the potential at the sensed output node N2' by $V_{sig}$ at the time when the clock signal $\phi_3'$ goes to the "H" level to initiate the discharging of the capacitances C1' and C2', since the source-gate voltage of the MOS transistor Q2' is higher than the source-gate voltage of the MOS transistor Q1', the capacitance C2' is discharged faster than the capacitance C1', causing the potential V2 at the sensed output node N2' to drop faster than the potential V1 at the sensed output node N2'. When the potential at the sensed output node N2' has dropped to the threshold voltage of the n-channel MOS transistor, the MOS transistor Q1' is turned OFF to stop the discharging of the capacitance C1', stopping the potential drop at the sensed output node N1'. Since the potential drop at the sensed ouput node N1' stops at a potential sufficiently higher than the threshold voltage $V_{th(n-ch)}$ of the n-channel MOS transistor, the MOS transistor Q2' remains in the ON state. Accordingly, the charge in the capacitance C2' is all eventually discharged and the potential at the sensed output node N2' drops to the ground potential. Thus, the increase in the potential difference between the sensed output nodes N1' and N2' is completed.

As illustrated in FIG. 12, the sense circuit which is suitable for use in the memory device of the present invention is characterized in that the MOS transistors Q8' and Q9' differ in conductivity type from the MOS transistors Q1' and Q2'. As already described above, the potential difference between the sensed output nodes N1' and N2' is increased by positively discharging, via the MOS transistors Q1' and Q3', or Q2' and Q3' the charge stored in that one of the capacitances C1' and C2' which has the lower potential, and this operation is performed when the MOS transistors Q8' and Q9' are both in the OFF state. Accordingly, even if the MOS transistor Q10' is turned ON or OFF when the potential difference between the sensed output nodes N1' and N2' is increased, the charges stored in the capacitances C1' and C2' between the sensed output nodes N1' and N2' and the ground will not be discharged via the MOS transistor Q8' or Q9'.

Moreover, in the case of the sense circuit described previously with respect to FIG. 10 in which the input nodes and the sensed output nodes are isolated from each other, the clock signal $\phi_1$ is needed for isolating the input nodes N4 and N5 and the sensed output nodes N1 and N2, but the circuit shown in FIG. 12 does not call for such a clock signal for isolating the input nodes N4' and N5' and the sensed output nodes N1' and N2'. With the circuit of FIG. 12, it is therefore possible to reduce the time from the application of the input signals to the input nodes N4' and N5' to the provision of a sensed output signal having an increased potential difference at the sensed output nodes N1' and N2'.

The MOS transistors Q4' and Q5' may be n- or p-channel. When the n-channel MOS transistors are employed, the polarity of the clock signal $\phi_2'$ must be reversed. Furthermore, in order that the potentials at the sensed output nodes N1' and N2' may be raised up to the potential of the power source 104' in the initial state, it is necessary that the "H" level be higher than the potential of the power source 104' by at least the threshold voltage |VHD th(n-ch)| of the n-channel MOS transistor.

The MOS transistor Q10' is intended to prevent the formation of a DC path from the power source to the ground via the MOS transistors Q4', Q5', Q8' and Q9' during the charging of the capacitances C1', C2' and C3', thereby reducing power consumption. The MOS transistor Q10' can be dispensed with by setting the potential relationships between the nodes N4' and N1' and between N5' and N2' in a manner to prevent the formation of the DC path, i.e. so that the MOS transistors Q8' and Q9' are not turned ON.

Moreover, it is possible to use, as a circuit arrangement complementary to the above circuit, a circuit in which the MOS transistors Q1' to Q3' and Q10' are formed by p-channel MOS transistors and Q8' and Q9' by n-channel MOS transistors. In the latter case, it is necessary to use a negative power source and to reverse the polarity of the clock signals, but the principles of operation are identical with those in the above circuit.

Since the MOS transistors Q10' and Q3' can be made common and since many methods can be used for initialization to the same potential, the basic components of the sense circuit are the MOS transistors Q1' and Q2' of the same conductivity type and the MOS transistors Q8' and Q9' different in conductivity type.

As described above, the circuit shown in FIG. 12 has the advantages: (1) that the input nodes and the sensed output nodes are isolated from each other, (2) that since MOS transistors of different conductivity types such as the MOS transistors Q1', Q2' and Q8', Q9' are employed, the potential difference between the sensed output nodes N1' and N2' is increased when the MOS transistors Q8' and Q9' are in the OFF state and (3) that since no clock signal is needed for isolating the input nodes and the sensed output nodes, the operating time from the application of the input signals to the input nodes to the provision of the potential difference between the sensed output nodes as a sensed output signal can be reduced. Accordingly, the use of the sense circuit of FIG. 12 as the comparator in the multilevel detector Ji of the memory device of the present invention will speed up the operation thereof and permit the maintenance of the input signal level, and hence is of great utility.

Next, a detailed description will be given of the reference level generator for generating the reference levels necessary for sensing signals in the multilevel detector when using a semiconductor memory device fabricated as an integrated circuit composed of a large number of memory cells according to the present invention.

The supply of the (q−1) different reference levels of the multilevel detectors $J_1$ to $J_m$ shown in FIG. 1 may also be effected by a separately provided reference level generator. In such a case, however, the signal levels appearing on each data line are affected by noise when the data line is driven, and are provided via the selector 5' (FIG. 15), while the reference levels for sensing the signal levels are created by the reference level generator RG independently of the word lines 3 and the selector 5' and are provided to the comparators $R_1$ and $R_2$. This introduces difficulty in correctly setting the reference levels relative to fluctuations in the signal voltages arising from scattering of transistor constants, insulating film thicknesses, etc. caused during manufacture, making it necessary to provide a sufficient margin between adjacent levels. Furthermore, integration of a large number of memory cells with high density will increase the above-mentioned fluctuations, decreasing the operating margin to introduce the likelihood of malfunction.

Next, a description will be given of a reference level generator which uses dummy cells for the solution of the above-mentioned problems and is suitable for use in the memory device of the present invention.

Figure 15:
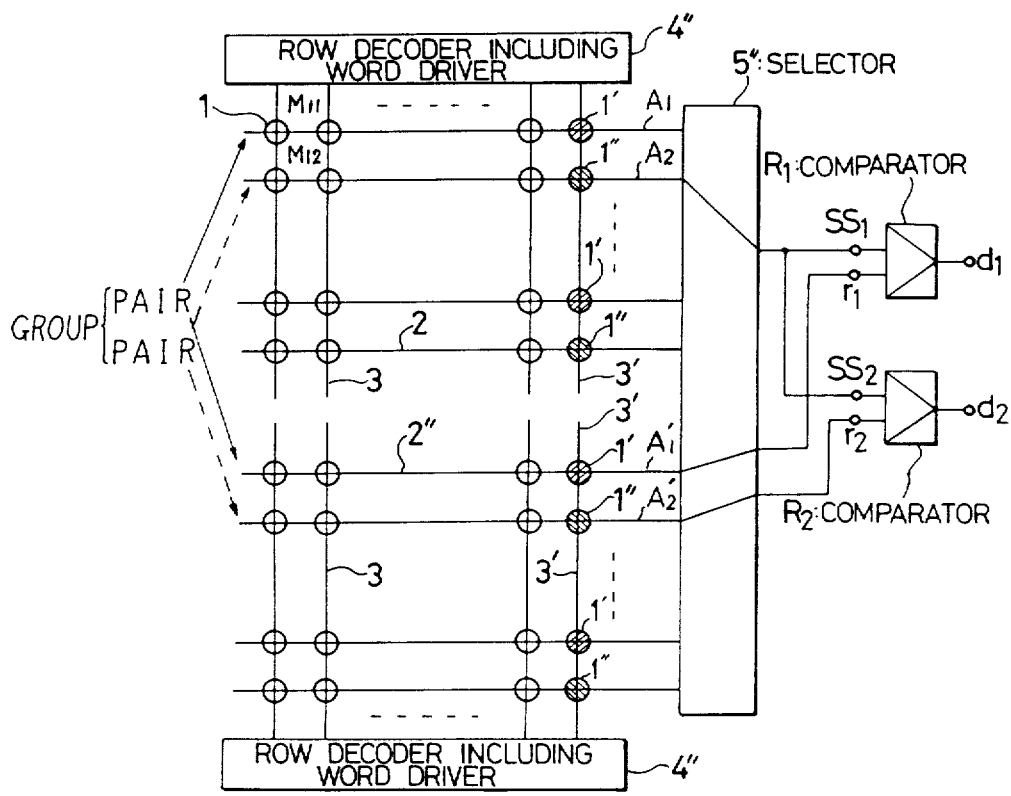
FIG. 15 is a circuit diagram illustrating another embodiment of a reference level control circuit (a reference level generator) for use in the signal detector of the memory device of the present invention.

FIG. 15 illustrates a circuit wich refers to reference levels produced by dummy cells. This example will be described with respect to the case where q=3. In FIG. 15 the memory cells are shown to be arranged in an open bit line structure. For the sake of brevity, however, the circuits $D_i$, $I_i$, $L_i$, $Q_i$ and $E_i$, the column decoder 5 and the input/output circuit 6 in FIG. 1 are not shown. It must be noted here that FIG. 15 shows only an arrangement which effectively operates for reading out q-level information stored in the memory cell $M_{12}$ when it is selected. In practice, multilevel detectors of the same number as that of the data lines in one memory cell array are provided, and q−1 (=2) pairs of data lines ($A_1$ and $A_1'$) are connected, as one group, to each multilevel detector. In FIG. 15, reference numeral 1' indicates dummy cells for generating a first reference level and 1" dummy cells for generating a second reference level. To each of data lines 2 and 2" are connected a plurality of memory cells and at least one dummy cell. The data lines each have the dummy cells in a repeating cyclic order 1'-1". One of row decoders including word drive 4" drives one of the word lines 3 for selecting one of the memory cells 1 and the other row decoder including word driver 4" drives another word line 3' for selecting one of the dummy cells 1' and 1", so that the reference level is provided on the data line different from that to which the selected memory cell is connected and on which the signal level appears. A selector 5" connects to signal input terminals $SS_1$ and $SS_2$ of the comparators $R_1$ and $R_2$ the data line ($A_2$) to which the selected memory cell is connected, and at the same time, it connects to the reference input terminals $r_1$ and $r_2$ of the comparators $R_1$ and $R_2$ the two data lines $A_1'$, $A_2'$ to which the dummy cells 1' and 1" are connected, respectively. The outputs from the comparators $R_1$ and $R_2$ are supplied via the sensed output terminals $d_1$ and $d_2$ to the gate circuit $L_1$ in FIG. 1. In this embodiment, since memory cells and dummy cells of the same number are connected to all the data lines as described above, parasitic capacitances, wiring resistances and so forth of the data lines can easily be set equal. Even if noise is generated which leads to variations in the data line levels during driving of the word lines 3 and 3', the influence cancelled each other between the data lines 2 and 2". In addition, since the signal level and the reference level are both provided via the selector 5" to the comparators $R_1$ and $R_2$, level fluctuations resulting from various scatter factors during the manufacture of the memory device will be cancelled.

Figure 16:
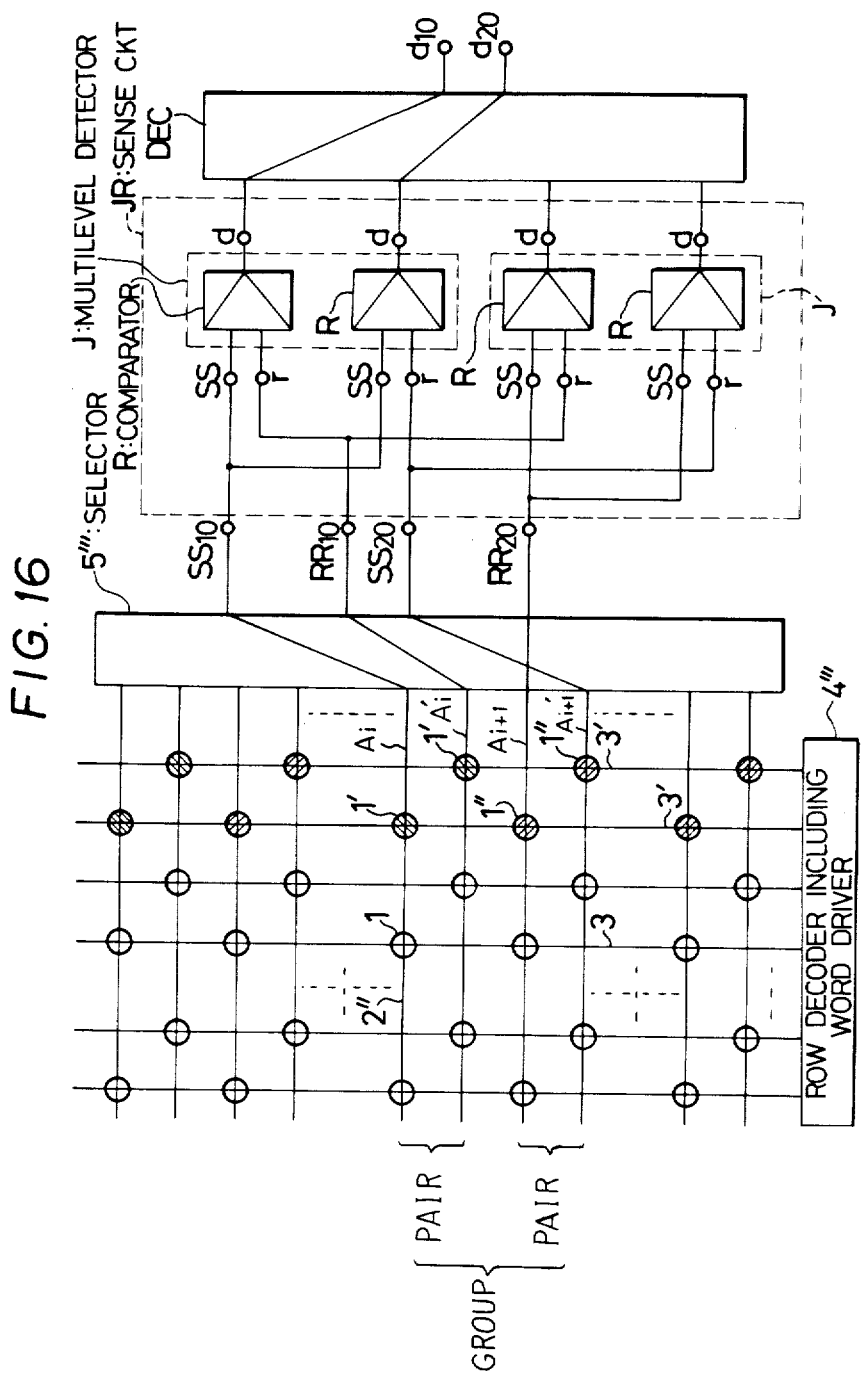
FIG. 16 is a circuit diagram illustrating still another embodiment of the reference level control circuit.

FIG. 16 illustrates another embodiment of the reference level generator which employs dummy cells. This embodiment also shows the case where q=3. In FIG. 16 the memory cells are shown to be arranged in a folded bit line structure. For the sake of brevity, the circuits $E_i$, $I_i$ and $D_i$ and the input/output circuit 6 are not illustrated, and the circuits $L_i$ and $Q_i$ and the column decoder 5 are indicated by a block identified as DEC. It must be noted here that FIG. 16 shows only an arrangement which effectively operates for reading out multilevel information stored in the memory cell on the data line $A_i$ when it is selected. A row decoder including word driver 4''' drives word lines 3 and 3' for selecting $(q-1)\times l$ memory cells and $l$ sets of $(q-1)$ different dummy cells which are connected to data lines the numbers of which are $2l(q-1)$, respectively. Reference character J indicates multilevel detectors, each including $(q-1)$ comparators (i.e. sense circuits) R, JR a sense circuit including $(q-1)$ multilevel detectors, $SS_{10}$ and $SS_{20}$ common signal input terminals, each connecting together two signal input terminals of the multilevel detectors J of the sense circuit JR, $RR_{10}$ and $RR_{20}$ common reference input terminals, each connecting together two reference input terminals r of different multilevel detectors J of the sense circuit JR, and DEC an multiplexer including a column decoder to output terminals $d_{10}$ and $d_{20}$. A selector 5''' connects to the common signal input terminals $SS_{10}$ and $SS_{20}$ two of data lines to which selected cells are connected, and at the same time, it connects to the common reference input terminals $RR_{10}$ and $RR_{20}$ two data lines to which two different dummy cells 1' and 1'' are connected by selection. With such an arrangement, any data lines are connected to the comparators of the same number. The output from the multiplexer including a column decoder DEC is applied to the input/output circuit 6 in FIG. 1.

Since this embodiment has an arrangement as described above, even if noise is generated which causes variations in the data line levels during driving of the word lines, the resulting influences are cancelled between the data lines. Further, since the signal level and the reference level are both supplied via the selector 5''' to the comparator R, level fluctuations resulting from the scatter of various factors during the manufacture of the memory device will also be cancelled.

With the arrangement shown in FIG. 16, the generation of the signal level and the generation of the reference level are common in terms of (1) the numbers of memory cells and dummy cells which are connected to each data line, (2) the situation of noise generation during driving of the word lines, (3) path of the selector and (4) the number of comparators to be connected. Accordingly, the influence of noise is cancelled almost completely, and this allows ease in setting reference levels in a semiconductor memory device having integrated memory cells capable of storing multilevel information, permitting the implementation of a semiconductor memory device which is almost free from malfunction arising from noise during operation and the scatter of various factors during manufacture.

With the use of the reference level generators depicted in FIGS. 15 and 16, it is possible to easily obtain a semiconductor memory device having integrated memory cells for storing multilevel information since they permit correct setting of a plurality of reference levels necessary for reading out the memory cells, as described above.

It is a matter of course that the reference level generators suitable for use in the memory device of the present invention are applicable to the case of employing memory cells which store not only ternary but also quaternary information or even more levels.

FIG. 17 illustrates an example of the arrangement of the reference level generator applied to a semiconductor memory device which has memory cells storing quaternary information. In this example the data lines are arranged in the folded bit line structure, and the memory cells are disposed on every other intersection of the data lines and the word lines. For instance, the memory cells $M_{11}$, $M_{31}$, $M_{51}$, ..., $M_{21}$, $M_{41}$, $M_{61}$, ..., $M_{12}$, $M_{32}$, $M_{52}$, and $M_{22}$, $M_{42}$, $M_{62}$, ... are connected to the word lines $C_1$, $C_1'$, $C_2$ and $C_2'$, respectively. Further, the row decoder including word driver 4''' has connected thereto the word lines $C_d$ and $C_d'$, which, in turn, respectively have connected thereto the dummy cells 1', 1'' and 1''' to every other data line. In this instance, a plurality of dummy cells are not connected to each data line. The row decoder including word driver 4''' selects the word lines $C_j$ (or $C_j'$) and $C_d'$ ($C_d$) at the same time. In FIG. 17 reference numeral 1 ($M_{11}$, $M_{31}$, ...) indicates memory cells, 1', 1'' and 1''' dummy cells for generating reference levels $VR_1$, $VR_2$ and $VR_3$, respectively, 4''' a row decoder including word driver and 5''' a selector which selectively connects data lines A to multilevel detectors $J_1$, $J_2$, $J_3$, .... The reference level generator is identical in construction with that shown in FIG. 16. The level of the leftmost word line $C_1$ rises with the output of the row decoder including word driver 4''', by which the memory cells $M_{11}$, $M_{31}$ and $M_{51}$ connected to the word line $C_1$ are selected, and the level of the rightmost word line $C_d'$ rises, selecting the dummy cells 1', 1'' and 1''' connected thereto. As a result, voltage levels corresponding to the quaternary information stored in the memory cells $M_{11}$, $M_{31}$ and $M_{51}$ appear in the data lines $A_1$, $A_2$, $A_3$ to which they are connected, and the reference levels $VR_1$, $VR_2$ and $VR_3$ appear in the data lines $A_1'$, $A_2'$, $A_3'$ to which the selected dummy cells 1', 1'' and 1''' are connected, respectively. Similarly, memory cells $M_{71}$, $M_{91}$ ... and dummy cells, which connect to data lines $A_4'$, $A_5'$, ..., other than those shown are selected by row decoder 4''', and voltage levels corresponding to quaternary information stored in the memory cells and the reference levels $VR_1$, $VR_2$ and $VR_3$ appear in the data lines to which they are connected. In this example, three pairs of data lines ($A_1$ and $A_1'$, $A_2$ and $A_2'$, $A_3$ and $A_3'$) form a group, and the selector 5''' connects the data lines $A_1$, $A_2$ and $A_3$ of the memory cells to the multilevel detectors $J_1$, $J_2$ and $J_3$, respectively, and the data lines $A_1'$, $A_2'$, and $A_3'$ of the dummy cells to the multilevel detectors $J_1$, $J_2$ and $J_3$, respectively. Incidentally, when l sets of such groups exist, the number of data lines is $2\times(q-1)\times l$ and l sets of $(q-1)$ kinds of dummy cells are connected to each word line. For instance, the data line $A_1$ to which the memory cell $M_{11}$ is connected is connected to signal input terminals $SS_1$, $SS_2$ and $SS_3$ of a multilevel detector $J_1$; the data line $A_2$ to which the memory cell $M_{31}$ is connected is connected to signal input terminals $SS_1$, $SS_2$ and $SS_3$ of a multilevel detector $J_2$; and the data line $A_3$ to which the memory cells $M_{51}$ is connected to signal input terminals $SS_1$, $SS_2$ and $SS_3$ of a multilevel detector $J_3$. On the other hand, the data line $A_1'$ to which the dummy cells 1' is connected is connected to reference input terminals $r_1$ of the multilevel detectors $J_1$, $J_2$ and $J_3$; the data line $A_2'$ to which the dummy cell 1'' is connected is connected to reference input terminals $r_2$ of the multilevel detectors $J_1$, $J_2$ and $J_3$; and the data line $A_3'$ to which the dummy cell $1'''$ is connected is connected to reference input terminals $r_3$ of the multilevel detectors $J_1$, $J_2$ and $J_3$. The multilevel detectors $J_1$, $J_2$ and $J_3$ constitute a sense circuit, and 1 such sense circuits are formed in this example. In this case, data lines of other groups, not shown, are also connected by the selector $5'''$ to multilevel detectors not shown. Incidentally, the multilevel detectors $J_1$, $J_2$ and $J_3$ form one sense circuit and 1 such sense circuits exist. The multilevel detectors each have a comparator connected to the reference input terminal $r_1$ and the signal input terminal $SS_1$, a comparator connected to the terminals $r_2$ and $SS_2$ and a comparator connected to the terminals $r_3$ and $SS_3$. Each multilevel detector senses at one time the levels of the data lines to which the memory cells are connected and outputs a three-bit binary signal representing the sensed quaternary information. The other portions of this example are identical with those in FIG. 1. The column decoder 5 decodes an input address and selects only one column select line specified by the input address. For example, when the column select line $B_3$ is selected, the gate $L_3$ is enabled by the select signal $H_3$ and the output signal of the multilevel detector $J_3$ is encoded by the encoder $Q_3$, delivering from the binary data input/output circuit 6 two-bit binary data corresponding to the quaternary information. On the other hand, the refresh circuits $E_1$, $E_2$, . . . each convert the output signal of the multilevel detector connected thereto to quaternary information and provide the information on the corresponding data line, effecting refreshing.

It will be apparent that many modifications and variations may be effected without departing from the scope of the novel concepts of the present invention.

While in FIG. 17 the memory cells are shown to have the folded bit line arrangement, the same function as is obtainable therewith can similarly be achieved by the open bit line arrangement, as shown in FIG. 15. In such a case, it is necessary only that the word lines $C_1'$, $C_2'$, . . . and $C_d'$, the associated data lines $A_1'$, $A_2'$, . . . , the memory cells $M_{21}$, $M_{22}$, . . . and the dummy cells in FIG. 17 be disposed symmetrically with respect to the multilevel detectors.

Moreover, FIG. 17 illustrates in detail the arrangement of FIG. 16 corresponding to FIG. 1, and it is needless to say that the arrangement shown in FIG. 9 can also be similarly modified.

Besides, although the selectors $5''$ and $5''$ in FIGS. 15 to 17 have been described in connection with the readout operation, they perform a similar selective control operation during writing as well.

What is claimed:

1. A memory device, comprising:
   $m \times n$ (where $m \geq 1$, $n \geq 1$, and m and n are integers) memory cells $M_{11}$ to $M_{1n}$, $M_{21}$ to $M_{2n}$, . . . , and $M_{m1}$ to $M_{mn}$;

m data lines $A_1$ to $A_m$ operatively connected to corresponding memory cells;

m column select lines $B_1$ to $B_m$ providing a column select signal;

n word lines $C_1$ to $C_n$ operatively connected to corresponding memory cells and providing a word select signal;

write means for providing on data line $A_i$ q-level information corresponding to binary data of plural bits when selected by the column select signal;

readout means for simultaneously outputting binary data of plural bits corresponding to the q-level information provided from the memory cell $M_{ij}$ (where $j=1, 2, \ldots n$) on the data line $A_i$ when selected by the column select signal, said readout means comprising m multilevel detectors $J_1$ to $J_m$ connected to corresponding data lines, m gate circuits $L_1$ to $L_m$ connected to corresponding multilevel detectors and m encoders $Q_1$ to $Q_m$ connected between corresponding column select lines and gate circuits, and the multilevel detector $J_i$ including $(q-1)$ comparators, each having one signal input terminal and one reference input terminal, and where the signal input terminal of the $(q-1)$ comparators are connected in common to the data line $A_i$ to which the selected memory cell $M_{ij}$ is connected and the reference input terminals of the $(q-1)$ comparators are supplied with $(q-1)$ different reference levels, respectively, the memory cell $M_{ij}$, when selected by the word select signal from the word line $C_j$, storing the q-level information provided on the data line $A_i$ and when the gate circuit $L_i$ is selected by the column select signal from the column select line $B_i$, the multilevel detector $J_i$ provides via the selected gate circuit $L_i$ to the encoder $Q_i$, a sense circuit output corresponding to the q-level information in the memory cell $M_{ij}$ and the encoder $Q_i$ outputs binary data of plural bits representing the q-level information.

2. A memory device according to claim 1, wherein said write means comprises m write circuits $D_1$ to $D_m$ connected to corresponding column select lines and m gate circuits $I_1$ to $I_m$ connected between corresponding data lines and write circuits, and when the gate circuit $I_i$ is selected by the column select signal from the column select line $B_i$, the write circuit $D_i$ outputs the q-level information corresponding to the binary data of plural bits on the data line $A_i$ via the selected gate circuit $I_i$.

3. A memory device according to claim 1, wherein said write means comprises a write circuit connected to the column select lines and common to the data lines $A_1$ to $A_m$ and m gate circuits $I_1$ to $I_m$ connected between the write circuit and corresponding data lines, and when the gate circuit $I_i$ is selected by the column select signal from the column select line $B_i$, the write circuit outputs the q-level information corresponding to the binary data of plural bits on the data line $A_i$ via the selected gate circuit $I_i$.

4. A memory device according to claim 1, wherein said write means comprises m write circuits $D_1$ to $D_m$ connected to corresponding column select lines and m gate circuits $I_1$ to $I_m$ connected between corresponding write circuits and data lines, and when the gate circuit $I_i$ is selected by the column select signal from the column select line $B_i$, the write circuit $D_i$ provides, via the selected gate circuit $I_i$ on the data line $A_i$, the q-level information corresponding to the binary data of plural bits.

5. A memory device according to claim 1, further comprising m refresh circuits $E_1$ to $E_m$ connected to corresponding data lines, multilevel detector circuits and gate circuits, the refresh circuit $E_i$ provides q-level information corresponding to the sense circuit output signal from the multilevel detector $J_i$ on the data line $A_i$ for rewrite into the memory cell $M_{ij}$.

6. A memory device according to claim 4, further comprising m refresh circuits $E_1$ to $E_m$, connected to corresponding data lines, multilevel detector circuits and gate circuits, the refresh circuit $E_i$ provides q-level information corresponding to the sense circuit output signal from the multilevel detector $J_i$ on the data line $A_i$ for rewrite into the memory cell $M_{ij}$.

7. A memory device according to claim 1, wherein said write means comprises a write circuit connected to the column select lines and common to the data lines $A_1$ and $A_m$ gate circuits $I_1$ to $I_m$ connected between the write circuit and corresponding data lines, and when the gate circuit $I_i$ is selected by the column select signal from the column select line $B_i$, the write circuit provides the q-level information corresponding to the binary data of plural bits on the data line $A_i$ via the selected gate circuit $I_i$.

8. A memory device according to claim 1, further comprising m refresh circuits $E_1$ to $E_m$ connected to corresponding data lines, multilevel detectors and gate circuits, the refresh circuit $E_i$ provides q-level information corresponding to the sense circuit output signal from the multilevel detector $J_i$ on the data line $A_i$ for rewrite into the memory cell $M_{ij}$.

9. A memory device according to claim 9, further comprising m refresh circuits $E_1$ to $E_m$ connected to corresponding data lines, the refresh circuit $E_i$ provides q-level information corresponding to the sense circuit output signal from the multilevel detector $J_i$ on the data line $A_i$ for rewrite into the memory cell $M_{ij}$.

10. A memory device according to claim 1, wherein the comparators each comprise:
   a first MOS transistor having a drain connected to a first node and having a gate;
   a second MOS transistor of the same conductivity type as the first MOS transistor, having a gate connected to the first node and having a drain;
   a first capacitance connected between the first node and ground;
   a third MOS transistor different in conductivity type from the first MOS transistor, having a source connected to the drain of the first MOS transistor and having a gate, the gate of the first MOS transistor and the drain of the second MOS transistor being connected to a second node;
   a second capacitance connected between the second node and ground; and
   a fourth MOS transistor different in conductivity from the second MOS transistor, having a source connected to the drain of the second MOS transistor and having a gate, and two input signals the potential difference of which is to be detected are applied to the gates of the third and fourth MOS transistors and then charges stored in the first and second capacitances are discharged via the first and second MOS transistors.

11. A memory device according to claims 1, 5, 6, 8 or 9, further comprising:
   a selector, connected between said data lines and said multilevel detectors, for selectively connecting the data lines to the multilevel detectors;
   dummy cells each connected to a corresponding data line and selected by the word select signals from the word lines, the number of the data lines being $2(q-1) \times l$ (where $l \geq 1$) and the data lines are divided into l groups, each comprising $(q-1)$ pairs of two different data lines; and
   l sense circuits corresponding to the l groups of data lines, where each sense circuit comprises $(q-1)$ multilevel detectors, each including $(q-1)$ comparators each having one signal input terminal connected to a corresponding data line and one reference input terminal, and the selector selects one of the data lines of each data line pair for connection to the signal input terminals of all the comparators of the corresponding multilevel detector of the corresponding sense circuit and selects the other of the data lines of each data line pair for connection to the reference input terminals of all the comparators each of which belongs to different multilevel detectors of the corresponding sense circuits, the other $(q-1)$ data lines having connected thereto $(q-1)$ different dummy cells providing different reference levels, respectively.

12. A memory device according to claim 11, wherein the comparators each comprise:
   a first MOS transistor having a drain connected to a first node and having a gate;
   a second MOS transistor of the same conductivity type as the first MOS transistor, having a gate connected to the first node and having a drain;
   a first capacitance connected between the first node and ground;
   a third MOS transistor different in conductivity type from the first MOS transistor, having a source connected to the drain of the first MOS transistor and having a gate, the gate of the first MOS transistor and the drain of the second MOS transistor being connected to a second node;
   a second capacitance connected between the second node and ground;
   a fourth MOS transistor different in conductivity from the second MOS transistor, having a source connected to the drain of the second MOS transistor and having a gate, and two input signals the potential difference of which is to be detected are applied to the gates of the third and fourth MOS transistors and then charges stored in the first and second capacitances are discharged via the first and second MOS transistors.

13. A memory device provided with data lines having connected thereto integrated memory cells, capable of q (where $q \geq 3$) different information storage states, and word lines for selecting the memory cells, said device comprising:
   a row decoder connected to the word lines and including a word driver for selecting the memory cells connected to a specified one of the word lines;
   a selector, connected to the memory cells, for selecting a specified one of the data lines;
   at least $(q-1)^2$ comparators connected to the selector and for connection to the selected data lines; and
   at least $(q-1)$ different dummy cells, connected to the selector, for generating reference levels in the data lines; and
   the comparators each have one signal input terminal and one reference input terminal, the $(q-1)$ comparators forming a multilevel detector and $(q-1)$ multilevel detectors forming a sense circuit having $(q-1)$ common signal input terminals for connecting together the signal input terminals of the $(q-1)$ comparators of each multilevel detector and $(q-1)$ common reference input terminals for connecting together the reference input terminals of the $(q-1)$ comparators each of which belong to different multilevel detector, where more than $(q-1)$ memory cells and the $(q-1)$ different dummy cells are selected simultaneously under control of the row decoder including the word driver, the selected memory cells and the dummy cells are connected to 2(q−1) different data lines, (q−1) of the data lines to which the selected memory cells are connected are connected to different common signal input terminals under the control of the selector, and the (q−1) data lines to which the selected (q−1) different dummy cells are connected are connected to different common reference input terminals.

* * * * *

UNITED STATES PATENT AND TRADEMARK OFFICE
CERTIFICATE OF CORRECTION

PATENT NO. : 4,771,404

DATED : September 13, 1988

INVENTOR(S) : Mano et al.

It is certified that error appears in the above-identified patent and that said Letters Patent is hereby corrected as shown below:

```
Col. 1,    line 16, "≤" should be --≥--;
           line 17, "≤" should be --≥--.

Col. 2,    line 9, "≤" should be --≥--.

Col. 4,    line 62, "≤" should be --≥-- (both occurrences)

Col. 5,    line 25, "≤" should be --≥--;
           line 28, "≤" (both occurrences) should be --≥--.

Col. 9,    line 2, "ji" should be --Ji--.

Col. 10,   line 47, "sume" should be --sum--.

Col. 12,   line 23, "resepctive" should be --respective--.

Col. 13,   line 35, "transsitor" should be --transistor--.

Col. 14,   line 12, "Q;'" should be --Q1'--.

Col. 17,   line 12, "(q-1)x1" should be --(q-1)xℓ --;
                    "1" (second occurrence) should be --ℓ --;
           line 14, "21" should be --2ℓ --.
```

UNITED STATES PATENT AND TRADEMARK OFFICE
CERTIFICATE OF CORRECTION

PAGE 2 OF 2

PATENT NO. : 4,771,404

DATED : September 13, 1988

INVENTOR(S) : Mano et al.

It is certified that error appears in the above-identified patent and that said Letters Patent is hereby corrected as shown below:

Col. 18, line 53, "1" should be -- $\ell$ --;

line 54, "2x(q-1)x1" should be --2(q-1) x $\ell$ --;
"1" (second occurrence) should be -- $\ell$ --.

Col. 19, line 5, "1" should be -- $\ell$ --;
line 9, "1" should be -- $\ell$ --.

Col. 21, claim 9, line 1, "9" should be --1--.

claim 11:
line 61, "2(q-1)x1" should be --2(q-1) x $\ell$ --;
"(where 1" should be --(where $\ell$ --.
line 62, "1" should be -- $\ell$ --.
line 64, "1" (both occurrences) should be -- $\ell$ --.

Signed and Sealed this

Eleventh Day of April, 1989

Attest:

DONALD J. QUIGG

Attesting Officer

Commissioner of Patents and Trademarks